(12) United States Patent
Lin et al.

(10) Patent No.: US 6,864,536 B2
(45) Date of Patent: Mar. 8, 2005

(54) ELECTROSTATIC DISCHARGE PROTECTION CIRCUIT

(75) Inventors: Shi-Tron Lin, Taipei (TW); Wei-Fan Chen, Taichung (TW); Chenhsin Lien, Hsinchu (TW); Wan-Yun Lin, Taipei (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/740,016

(22) Filed: Dec. 20, 2000

(65) Prior Publication Data

US 2002/0074602 A1 Jun. 20, 2002

(51) Int. Cl.[7] .......................... H01L 23/62; H01L 29/76
(52) U.S. Cl. ...................... 257/355; 257/358; 257/363; 257/401
(58) Field of Search ............................. 257/355–363, 257/401, 647

(56) References Cited

U.S. PATENT DOCUMENTS

| | | | |
|---|---|---|---|
| 5,248,892 A | 9/1993 | Van Roozendaal et al. | |
| 5,721,439 A | 2/1998 | Lin | |
| 5,742,083 A | 4/1998 | Lin | |
| 5,763,919 A | 6/1998 | Lin | |
| 6,064,095 A | 5/2000 | Fu | |
| 6,236,073 B1 * | 5/2001 | Hsu | 257/355 |
| 6,509,585 B2 * | 1/2003 | Huang | 257/173 |

FOREIGN PATENT DOCUMENTS

JP       1-307271       * 12/1989   ................. 257/347

* cited by examiner

Primary Examiner—Ori Nadav
(74) Attorney, Agent, or Firm—Finnegan, Henderson, Farabow, Garrett & Dunner, L.L.P.

(57) ABSTRACT

An electrostatic discharge (ESD) protection device includes a semiconductor layer, a source region formed in the layer, a drain region formed in the layer, a channel region in the layer between the source and drain regions, and a gate over the channel region. A plurality of current divider segments are distributed on the drain region and extend between the gate and drain contacts. The segments can be formed of polysilicon or a field oxide.

36 Claims, 28 Drawing Sheets

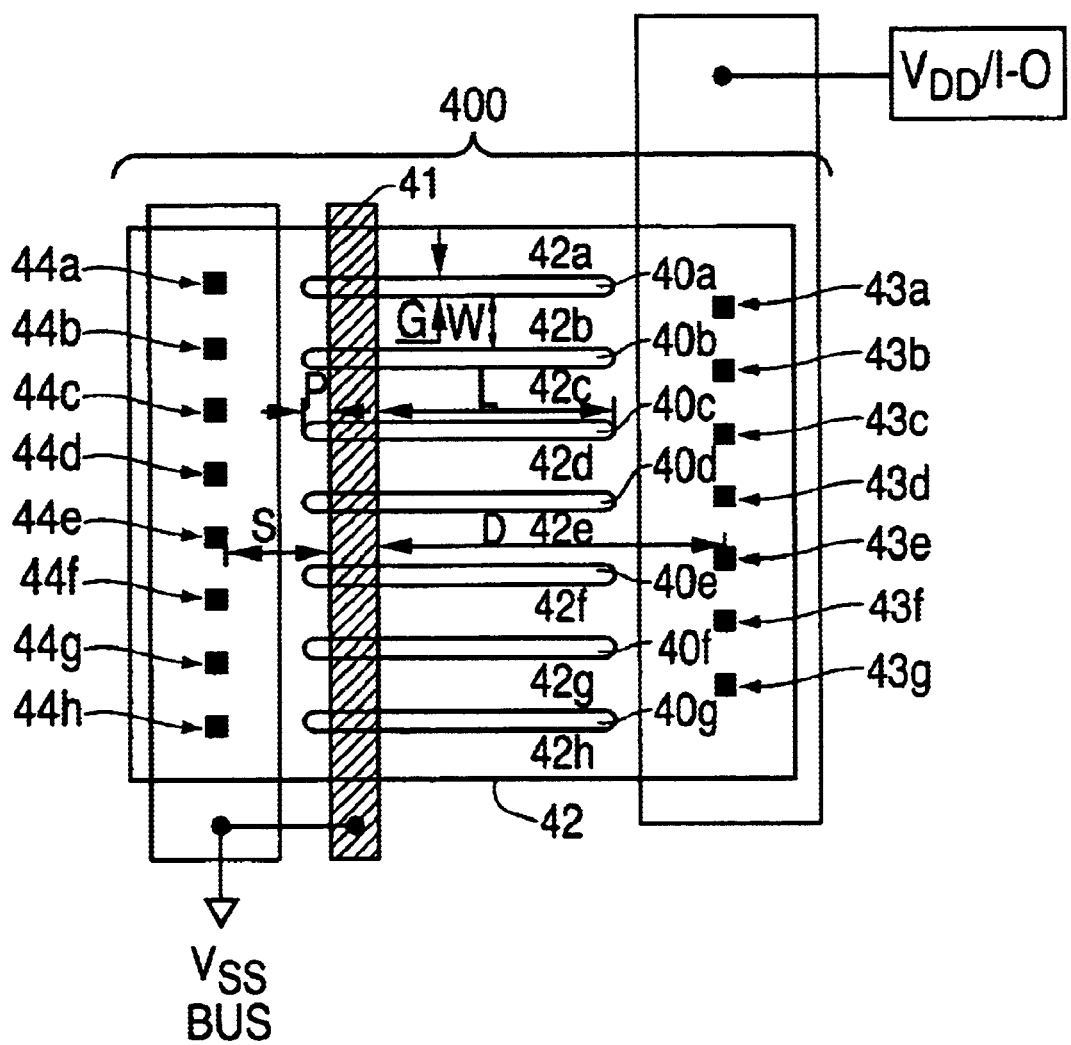

ELECTROSTATIC DISCHARGE PROTECTION CIRCUIT

BACKGROUND OF THE INVENTION

1. Field of the Invention

The present invention relates in general to a transistor structure for an electrostatic discharge (ESD) protection circuit and, more particularly, to an ESD protection device having improved performance.

2. Description of the Related Art

Metal oxide semiconductor (MOS) integrated circuits (ICs) receive input signals through the gate of a MOS transistor. If a high voltage input signal is applied to the gate terminal, the gate oxide layer may be unable to withstand the high voltage and break down. Higher than normal input voltages may be produced when semiconductor devices are transported by humans or machines. However, the sources of abnormally high voltages are many. For example, electric charges can be produced by friction between surfaces or when an IC is unpacked from plastic packaging. Static electricity can range from several hundreds volts to several thousand volts. If such high voltages are applied to the pins of an IC package, voltage breakdown of the gate oxide layer of a transistor within the package can occur which would result in the transistor being inoperative. As a result, the entire IC could be rendered inoperative.

To prevent such damages to the MOS transistors, protective circuits are connected to pins of an IC package. Such protective circuits are typically connected between each input/output (I/O) pad and the integrated circuit. The protective circuits are designed to conduct when a high voltage is applied to the I/O pad. Hence, these protective circuits provide an electrical path to, e.g., ground, to safely discharge the high voltage.

As feature sizes of semiconductor IC devices are reduced to the sub-micron level, one of the design rules for making high-speed ICs is to use self-aligned suicide (salicide) fabrication procedures to make MOS transistor components. The goal is to effectively reduce the sheet resistance in the source/drain regions, so that the fabricated MOS transistors operate at higher speeds. However, the use of salicides for high-speed device circuits results in the problem of maintaining adequate ESD protection for such circuits in these IC devices. If the ESD protection circuits are also implemented in the same salicide fabrication technology, then the sheet resistance in the N+ diffusion regions for the ESD protection circuits will fall from the traditional range of about 60Ω per-square for effective protection to about 2–3Ω per-square.

FIG. 1 is a reproduction of FIG. 4 of U.S. Pat. No. 5,742,083 which illustrates the layout of an ESD protection circuit. The ESD circuit shown in FIG. 1 includes an MOS transistor that includes field oxide islands 40a–40g that extend from a drain diffusion region 42 in the transistor drain side into the source side. Field oxide islands 40a–40g pass underneath a strip-shaped gate structure 41, but do not extend to a metallization overlying and connected to the drain diffusion region via contact openings 43a–43g. Islands 40a–40g serve to segment part of drain diffusion region 42, into segmented regions 42a–42g, across which current flows during an ESD event. This arrangement serves to partially distribute current during an ESD event which can improve ESD protection.

While the arrangement in FIG. 1 provides some improvement in ESD protection, further improvement is desirable.

SUMMARY OF THE INVENTION

Accordingly, the present invention is directed to an ESD protection device that substantially obviates one or more problems due to limitations and disadvantages of the related art.

Additional features and advantages of the invention will be set forth in the description which follows, and in part will be apparent from the description, or may be learned by practice of the invention. The objectives and advantages of the invention will be realized and attained by means of the elements and combinations particularly pointed out in the written description and claims hereof, as well as the appended drawings. To achieve these and other advantages and in accordance with the purpose of the invention, as embodied and broadly described, there is provided an electrostatic discharge protection device, comprising: a substrate; a first diffusion region formed in the substrate; a second diffusion region formed in the substrate adjacent to and spaced from the first diffusion region; contacts for making a conductive connection to the first diffusion region; a channel formed in a third region between the first and second diffusion region; and an elongate current divider extending between the channel and a region of the contacts.

Also in accordance with the present invention, there is provided an electrostatic discharge protection device, comprising: a substrate; a first diffusion region formed in the substrate; a second diffusion region formed in a spaced relationship to the first diffusion region; a third diffusion region formed in the substrate between and spaced from the first and second diffusion regions; a first gate overlying a region between the first and third diffusion regions; a second gate overlying a region between the second and third diffusion regions; contacts for making a conductive connection to the third diffusion region; a first elongate current divider extending between the first gate and a region of the contacts; and a second elongate current divider extending between the second gate and the region of the contacts.

Further in accordance with the present invention, there is provided an electrostatic discharge protection device, comprising: a substrate; a first diffusion region formed in the substrate; a second diffusion region formed in the substrate adjacent to and spaced from the first diffusion region; contacts for making a conductive connection to the first diffusion region; a channel formed in a third region between the first and second diffusion region; a first elongate current divider extending between the channel and a region of the contacts; and a second elongate current divider adjacent to the first divider and extending between the channel and a region of the contacts.

Additionally in accordance with the present invention, there is provided an electrostatic discharge protection device, comprising: a substrate; a first diffusion region formed in the substrate; a second diffusion region formed in a spaced relationship to the first diffusion region; a third diffusion region formed in the substrate between and spaced from the first and second diffusion regions; a first gate overlying a region between the first and third diffusion regions; a second gate overlying a region between the second and third diffusion regions; contacts for making a conductive connection to the third diffusion region; a plurality of adjacent first elongate current dividers extending between the first gate and a region of the contacts; and a plurality of adjacent second elongate current dividers extending between the second gate and the region of the contacts.

Further in accordance with the present invention, there is provided an electrostatic discharge protection device, comprising: a substrate; a first diffusion region formed in the substrate; a second diffusion region formed in the substrate adjacent to and spaced from the first diffusion region; contacts for making a conductive connection to the first diffusion region; a channel formed in a third region between the first and second diffusion regions; and a plurality of current divider segments formed within the first diffusion region, the respective segments each formed into one of at least two different shapes, two different sizes, or two different orientations, or two different spacings (gaps) between adjacent current divider segments.

Additionally in accordance with the present invention, there is provided an electrostatic discharge protection device, comprising: a substrate; a first diffusion region formed in the substrate; a second diffusion region formed in the substrate adjacent to and spaced from the first diffusion region; contacts for making a conductive connection to the first diffusion region; a channel formed in a third region between the first and second diffusion regions; and a plurality of small current divider segments formed within the first diffusion region and being one of evenly and unevenly distributed therein.

Also in accordance with the present invention, there is provided an electrostatic discharge protection device, comprising: a substrate; a first diffusion region formed in the substrate; a second diffusion region formed in the substrate adjacent to and spaced from the first diffusion region; contacts for making a conductive connection to the first diffusion region; a channel formed in a third region between the first and second diffusion regions; and a plurality of current divider segments formed within the first diffusion region and being unevenly distributed therein.

Further in accordance with the present invention, there is provided a method for forming an electrostatic discharge protection device, comprising the steps of: forming a substrate; forming a first diffusion region formed in the substrate; forming a second diffusion region in the substrate adjacent to and spaced from the first diffusion region; forming contacts for making a conductive connection to the first diffusion region; forming a channel in a third region between the first and second diffusion region; and forming an elongate current divider extending between the channel and a region of the contacts.

It is to be understood that both the foregoing general description and the following detailed description are exemplary and explanatory only and are not restrictive of the invention, as claimed.

The accompanying drawings are included to provide a further understanding of the invention and are incorporated in and constitute a part of this specification, illustrate embodiments of the invention, and together with the description serve to explain principles of the invention.

BRIEF DESCRIPTION OF THE DRAWINGS

FIG. 1 illustrates a portion of a prior art ESD protection device;

DETAILED DESCRIPTION OF THE PREFERRED EMBODIMENTS

Figure 2A:
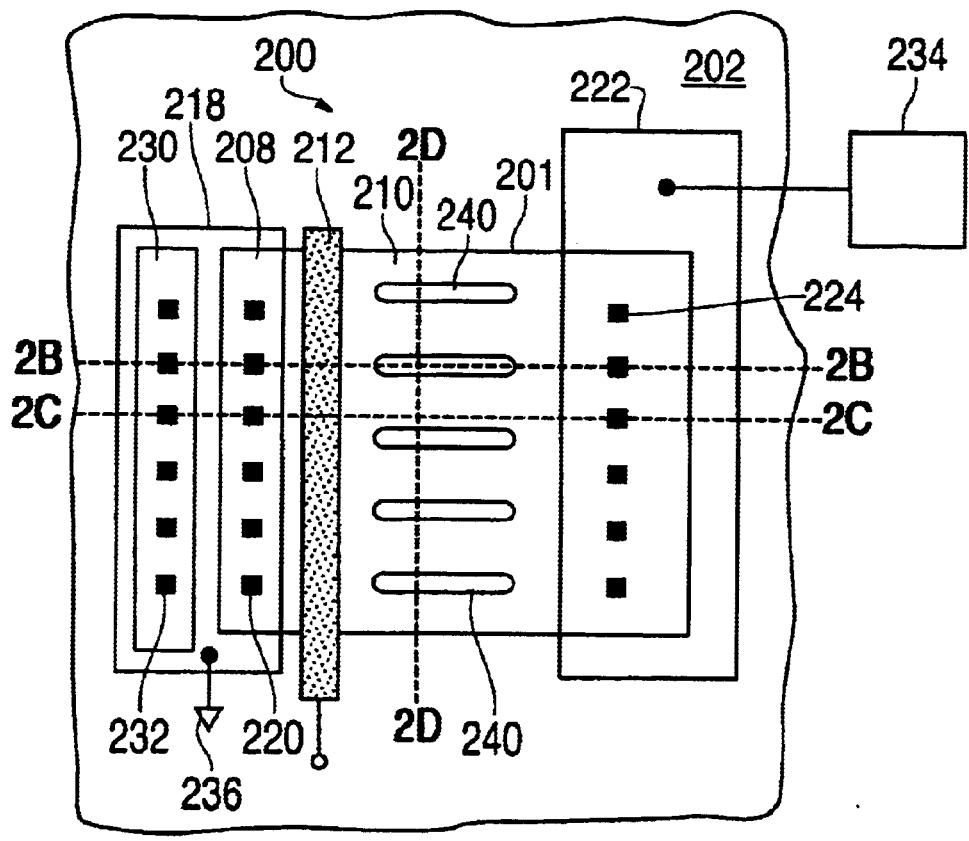
FIGS. 2A–2D illustrate an ESD protection device constructed according to a first embodiment of the present invention.

Embodiments consistent with the present invention comprise an MOSFET ESD protection device that includes current divider structures that at least partially divide current flow through the drain region during an ESD event. The current divider structures also increase impedance in the current flow path. A more evenly distributed current flow during the ESD event resulting from the divided current flow, as well as the increased impedance, result in the ESD device providing improved ESD voltage tolerance.

Throughout this description, like features are identified with the same reference numerals.

Figure 2B:
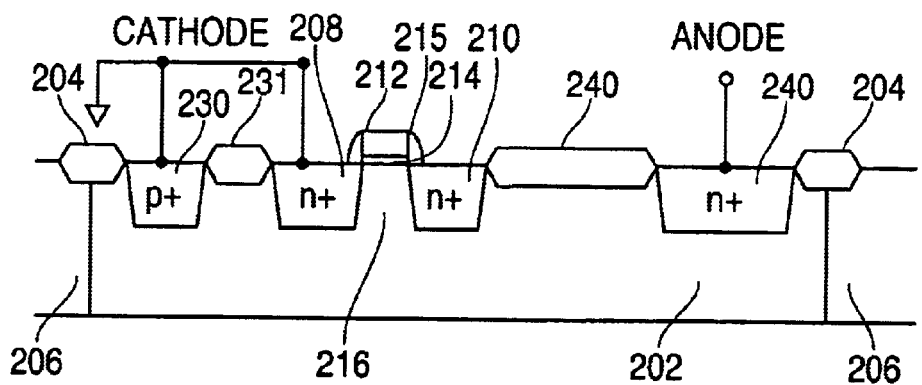
Figure 2C:
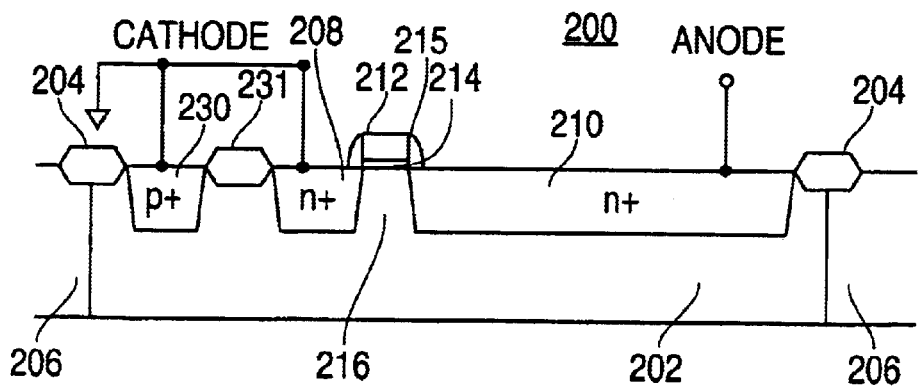
Figure 2D:
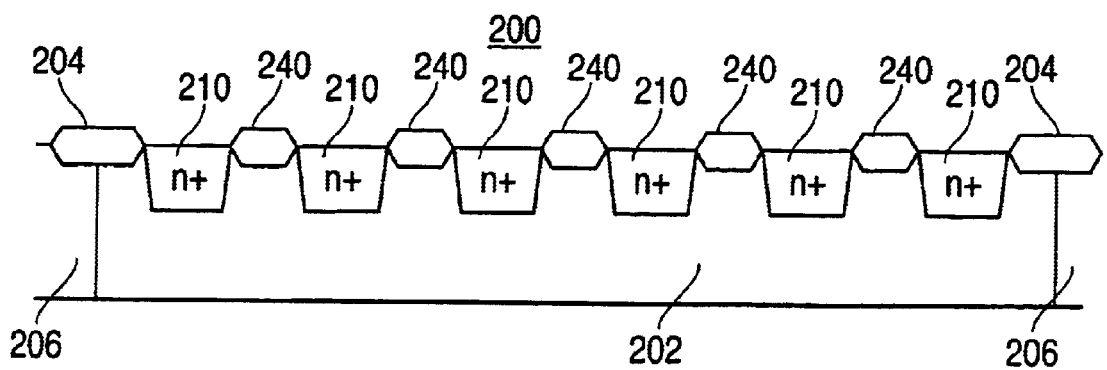

FIGS. 2A–2D illustrate an ESD protection device 200 according to a first embodiment of the present invention. FIGS. 2B, 2C, and 2D illustrate sections 2B—2B, 2C—2C, and 2D—2D indicated in FIG. 2A, which is a top view of device 200. Device 200 is formed within an active region 201 which is defined by, e.g., a surrounding field oxide. Device 200 can be formed in a p-well or p-type silicon substrate 202 and is isolated from adjacent devices by field oxide regions 204 and n-well regions 206. An N+ source region 208 and an N+ drain region 210 are formed in substrate 202. An elongate polysilicon gate 212 is disposed over a thin gate oxide 214 between regions 208 and 210. A channel region 216 is disposed under gate 212 and oxide 214. Oxide spacers 215 are formed on sides of gate 212. Metal bus layer 218 overlies source diffusion region 208 and is connected thereto by source contacts 220. A metal bus layer 222 overlies drain diffusion region 210 and is connected thereto by contacts 224. Layer 222 is an anode of device 200. The connections to regions 208 and 210 are shown diagrammatically in FIGS. 2B and 2C. The source and drain regions are typically heavily doped by ion implantation, followed by thermal diffusion at elevated temperature processing steps. Therefore, a source or drain region can be called a heavily doped region or a diffusion region.

A P+ region 230 is formed in substrate 202. Layer 218 is connected to region 230 by contacts 232. Region 230 serves as a guard ring that surrounds active region 201 and is spaced therefrom by a field oxide 231. Region 230 facilitates a low resistance connection to substrate 202. Drain region 210 can be coupled through layer 222 to an input, output, I/O pad or a first power bus, e.g., a $V_{DD}$ bus, 234. Source region 208 can be coupled through layer 218 to a second power bus, e.g., a $V_{SS}$ bus, 236. Gate 212 can be coupled directly to layer 218, i.e., the cathode, to form a grounded gate NMOS (GGNMOS) transistor, be coupled to layer 218 through a resistor (not shown), be coupled to layer 222, i.e., the anode, through a capacitor (not shown), or be coupled to a gate-driving signal. A terminal 238 is shown in FIG. 2A as connected to gate 212 to diagrammatically represent the various connection options for gate 212.

Device 200 further includes an array of elongate current divider segments 240 formed within drain region 210. Each segment 240 is formed of a field oxide. The space between adjacent segments 240 is greater than the width of each segment 240. For example, the space between adjacent segments 240 can be approximately two times the width of each segment 240. Alternatively, the space between adjacent segments can be greater, e.g., four times the segment width.

As seen in FIGS. 2A–2C, segments 240 are disposed between gate 212 and layer 222 but do not extend beneath either of gate 212 or layer 222. Segments 240 are preferably evenly spaced from each other and across a width of drain region 210.

Figure 3A:
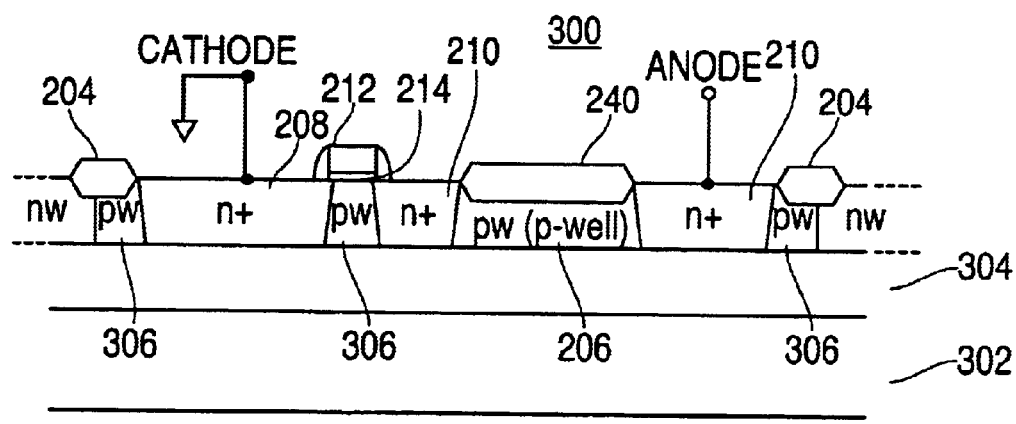
FIGS. 3A and 3B illustrate an ESD protection device that represents an alternate construction of the device illustrated in FIGS. 2A–2D.
Figure 3B:
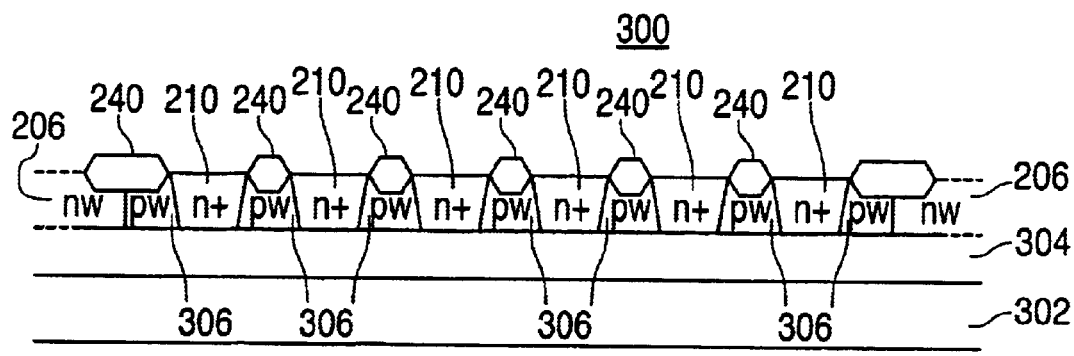

FIGS. 3A and 3B illustrate an ESD protection device 300 that represents an alternate construction of device 200. Device 300 is configured the same as device 200 except that device 300 is formed with silicon-on-insulator (SOI) process technology. FIGS. 3A and 3B illustrate cross-sectional views of device 300 that correspond to sections 2B—2B and 2D—2D of device 200, respectively. Device 300 includes a silicon substrate 302 and an insulator or implanted oxide layer 304 formed on substrate 302. Device 300 includes a p-well 306 that corresponds to substrate 202 and underlies gate 212 and segments 240.

Figure 4A:
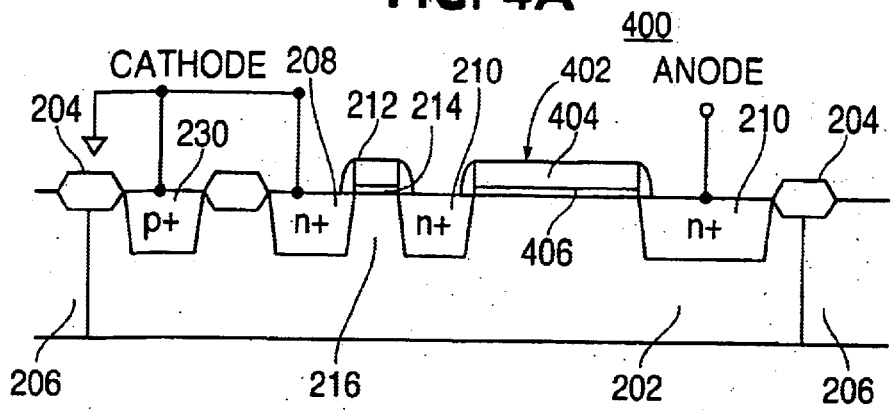
FIGS. 4A and 4B illustrate an ESD protection device that represents another alternate construction of the device illustrated in FIGS. 2A–2D.
Figure 4B:
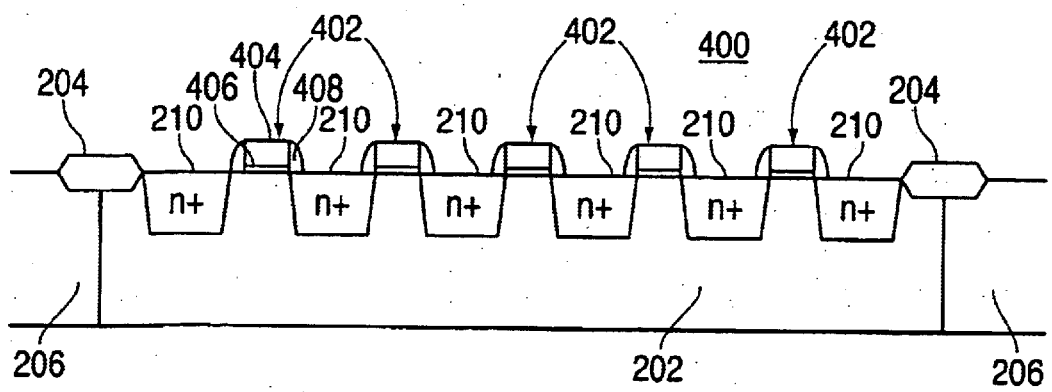

FIGS. 4A and 4B illustrate an ESD protection device 400 that represents another alternate construction of device 200. Device 400 is configured the same as device 200 except that device 400 includes an array of elongate current divider segments 402 that are each formed of a polysilicon layer 404 over a thin oxide layer 406, instead of field oxide segments 240. Each segment 402 also includes oxide spacers 408 surrounding its periphery. FIGS. 4A and 4B illustrate cross-sectional views of device 400 that correspond to sections 2B—2B and 2D—2D of device 200, respectively.

Figure 4C:
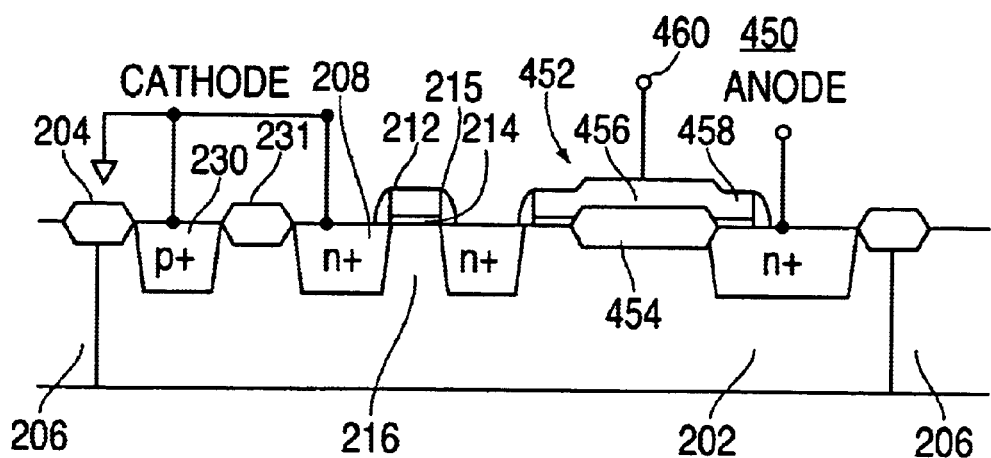
FIGS. 4C and 4D illustrate an ESD protection device that represents another alternate construction of the device illustrated in FIGS. 2A–2D.
Figure 4D:
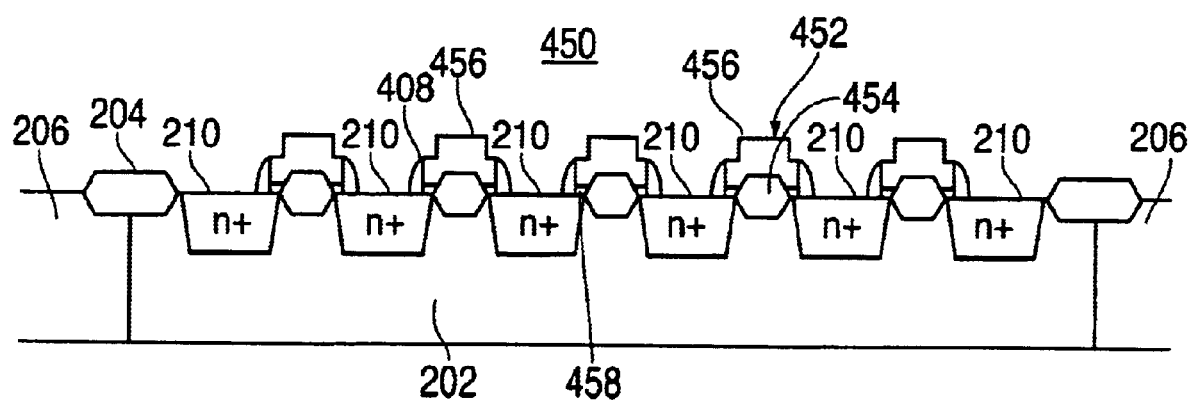

FIGS. 4C and 4D illustrate an ESD protection device 450 that represents yet another alternate construction of device 200. Device 450 is configured the same as device 200 except that device 450 includes an array of elongate current divider segments 452 that are each formed of field oxide overlayed by polysilicon. FIGS. 4C and 4D illustrate cross-sectional views of device 450 that correspond to sections 2B—2B and 2D—2D of device 200, respectively. As seen in FIGS. 4C and 4D, each segment includes a field oxide layer 454 disposed on substrate 202 and a polysilicon layer 456 disposed over layer 454. The periphery of layer 456 extends beyond the edge of layer 454. A thin oxide 458 is disposed between that peripheral portion of layer 456 and substrate 202. Optionally, a connection 460 can be provided to layer 456 for connection to, e.g., ground, gate 212, or drain contact 224, at a designer's discretion. Existence of the underlying field oxide layer 454 which is thick relative to a typical gate oxide, enhances the ability to form a metal contact directly on polysilicon on field oxide for making connection 460 to layer 456.

Figure 4E:
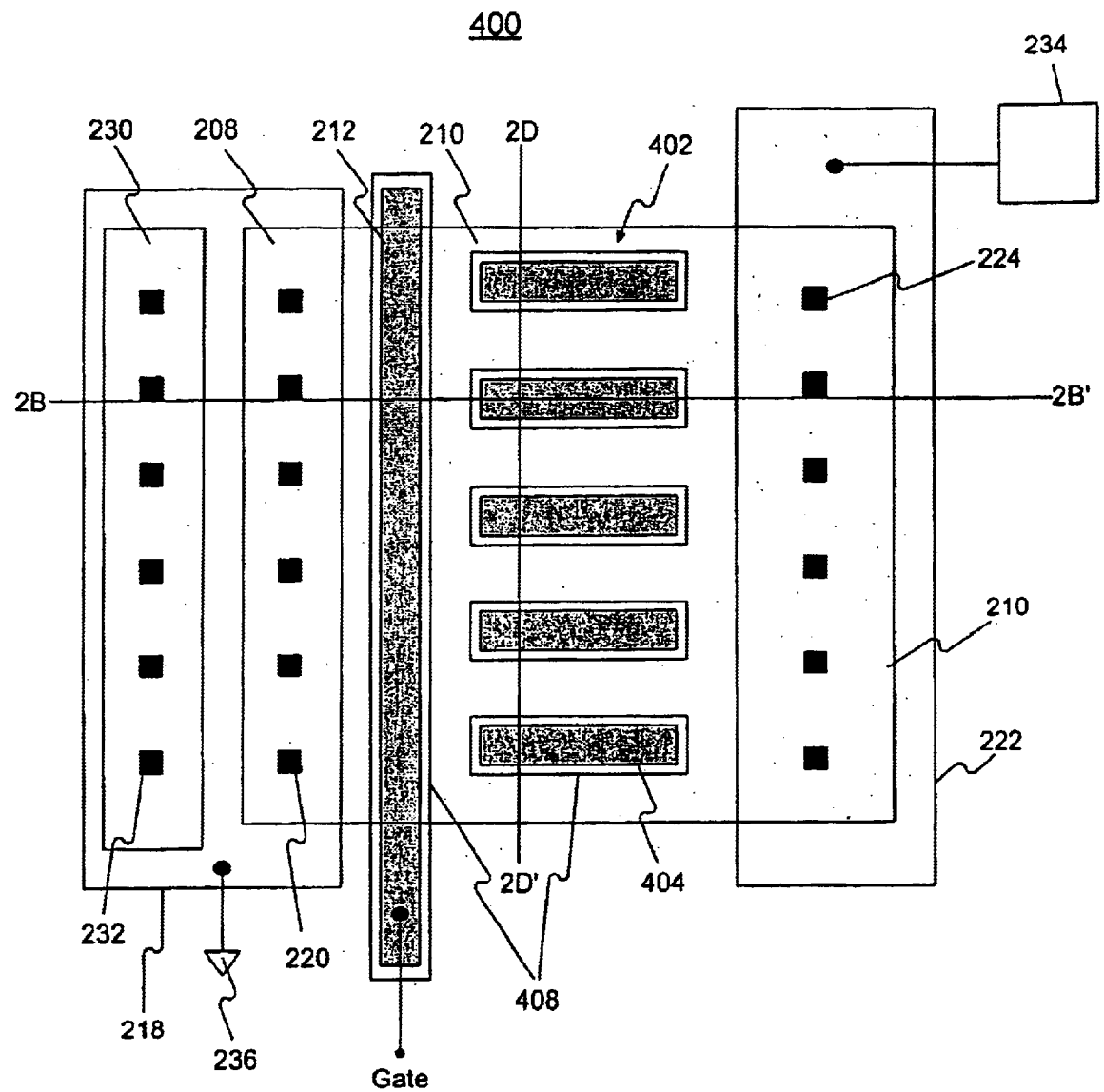
FIG. 4E illustrates a plan view of the ESD protection device shown in FIGS. 4A–4B.

FIG. 4E is a plan view of device 400 illustrate in FIGS. 4A and 4B, which is an alternate construction of device 200.

Figure 5:
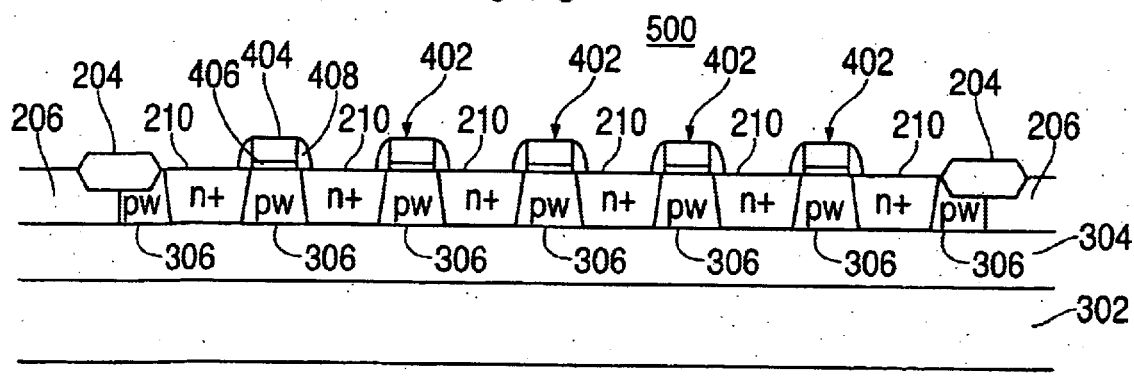
FIG. 5 illustrates an ESD protection device that represents yet another alternate construction of the device illustrated in FIGS. 2A–2D.

FIG. 5 illustrates an ESD protection device 500 that represents yet another alternate construction of device 200. Device 500 is configured the same as device 200 except that device 500 is both formed with SOI process technology and with current divider segments 402 formed of polysilicon layer 404 over oxide layer 406.

In each of devices 200, 300, 400, and 500, the elongate current divider segments serve to segment or divide drain region 210 into a plurality of parallel current paths. The manner in which this arrangement of the current divider segments enhances ESD protection performance is described more fully below.

Figure 6:
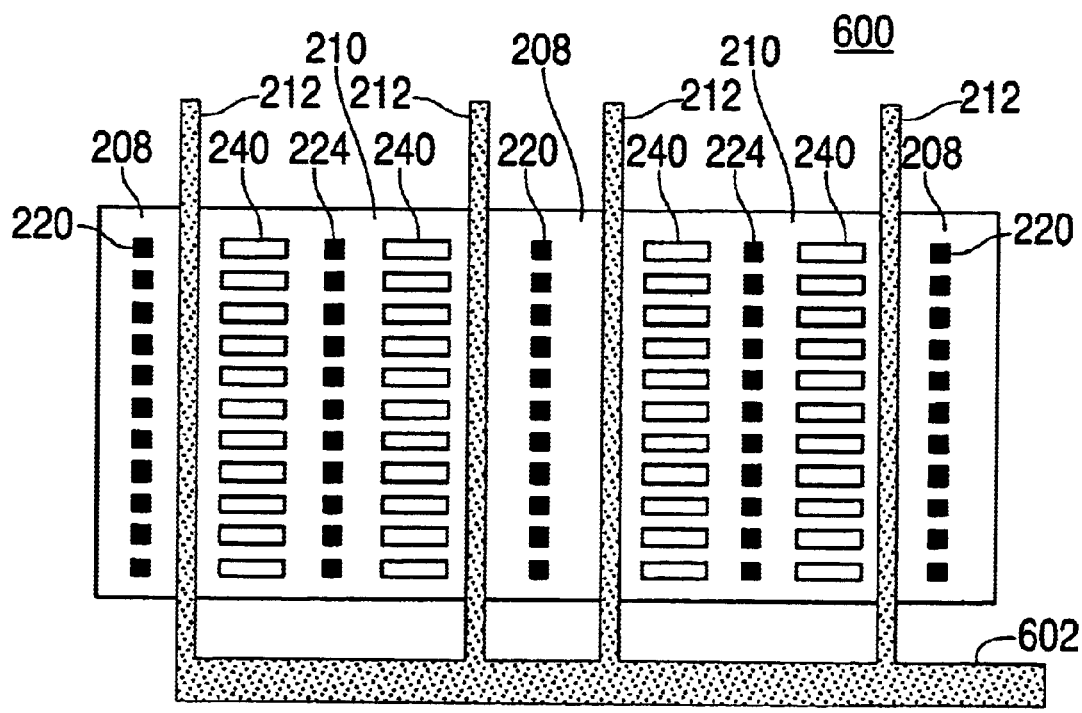
FIG. 6 is a plan view of an ESD protection device configured as a GGNMOS.

FIG. 6 is a plan view of an ESD protection device 600 that represents an implementation of the configuration of device 200 in a multi-gate-finger GGNMOS. Thus, device 600 includes a plurality of polysilicon gates 212 respectively connected to a polysilicon or metal interconnect 602. Rectangle 604 defines an active region, surrounded by field oxide, within which device 600 is formed. Device 600 includes a plurality of source regions 208 and drain regions 210 with each gate 212 disposed between a pair of regions 208 and 210. Contacts 220 provide connections to each source region 208 and contacts 224 provide connections to each drain region 210. Device 600 includes metal bus layers, not shown, that contacts 220 and 224 connect to. A plurality of field oxide current divider segments 240 are formed within each of drain regions 210.

Figure 7A:
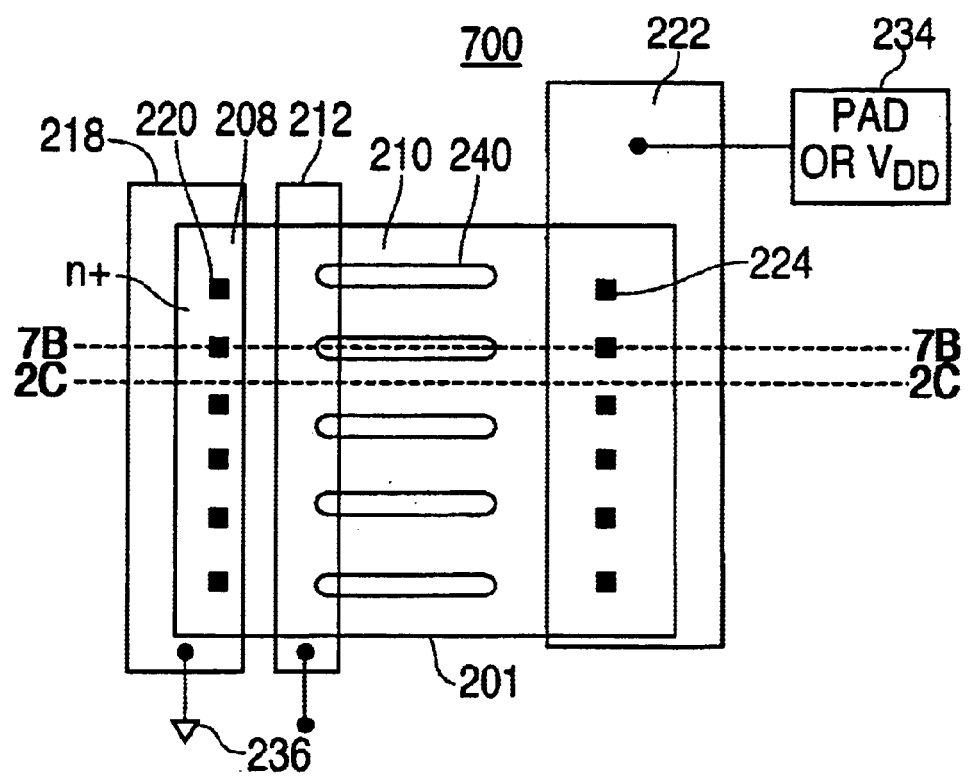
FIGS. 7A and 7B illustrate an ESD protection device constructed according to a second embodiment of the present invention.
Figure 7B:
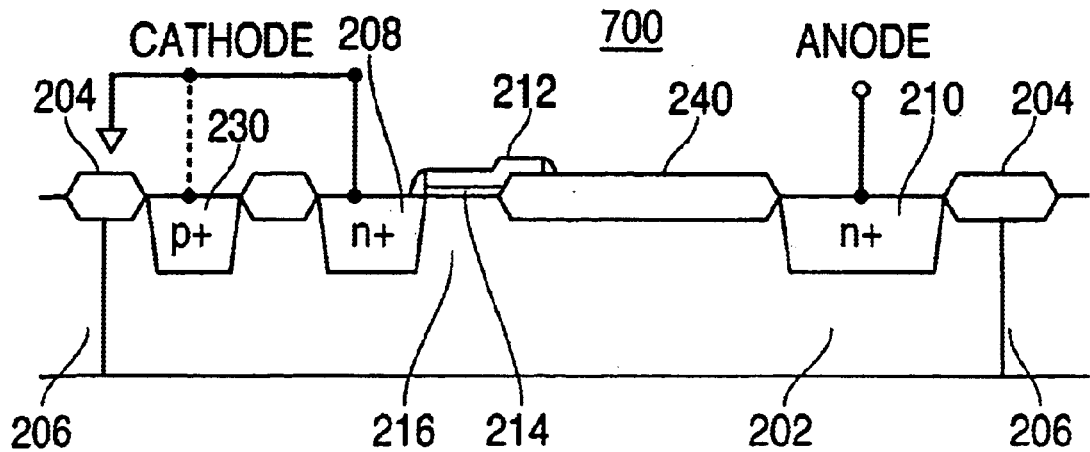

FIGS. 7A and 7B illustrate an ESD protection device 700 according to a second embodiment of the present invention. FIG. 7A is a plan view of device 700 and FIG. 7B illustrates section 7B—7B indicated in FIG. 7A. Device 700 comprises the same features as device 200, except that one end of each current divider segment 240 extends partially underneath polysilicon gate 212. As illustrated in FIG. 7B, thin gate oxide 214 is only disposed on substrate 202, while gate 212 overlies both oxide 214 and an end of each segment 240.

Figure 7C:
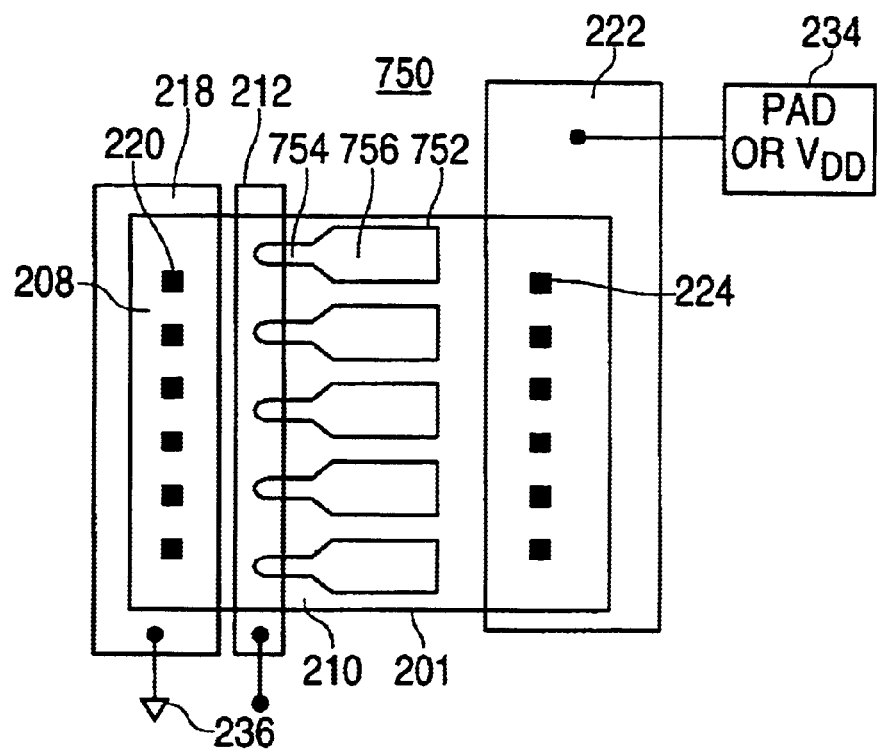
FIG. 7C illustrates a plan view of an alternate construction of that device.

FIG. 7C illustrates a plan view of an ESD protection device 750 that represents an alternate construction of device 700. In particular, device 750 includes field oxide current divider segments 752 that include a relatively narrow segment portion 754 that extends partially underneath polysilicon gate 212 and a relatively wider segment portion 756 that extends within drain region 210. The use of segments 752 is efficacious in devices formed by salicide or silicided diffusion processes because the wider segment portions 756 serve to narrow current paths and thereby increase drain resistance for improved ESD performance. Further, since the effect of providing wider segment portions 756 is to increase drain resistance, each field oxide segment can instead be configured with at least some portion of its length having an increased width to provide a narrowed portion of current path in the drain region.

Figure 8A:
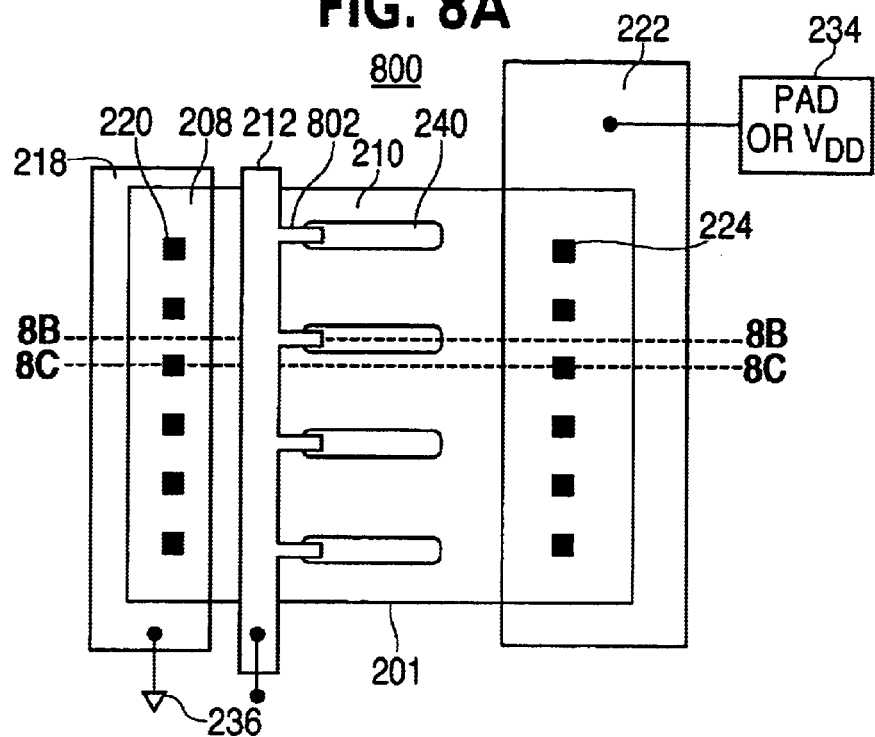
FIGS. 8A–8C illustrate an ESD protection device constructed according to a third embodiment of the present invention.
Figure 8B:
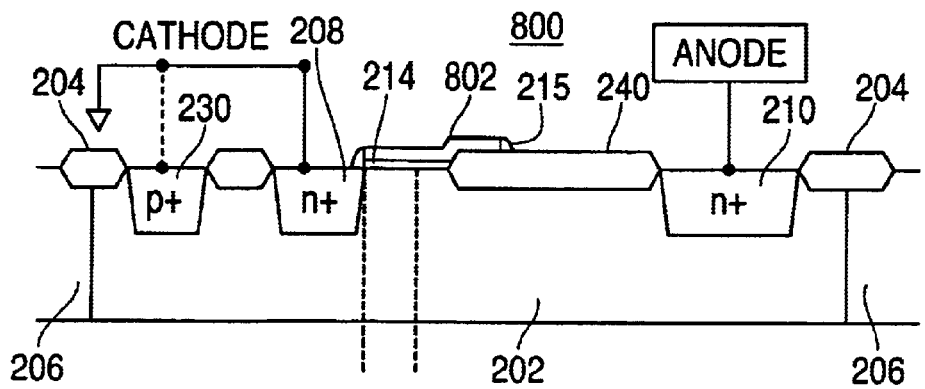
Figure 8C:
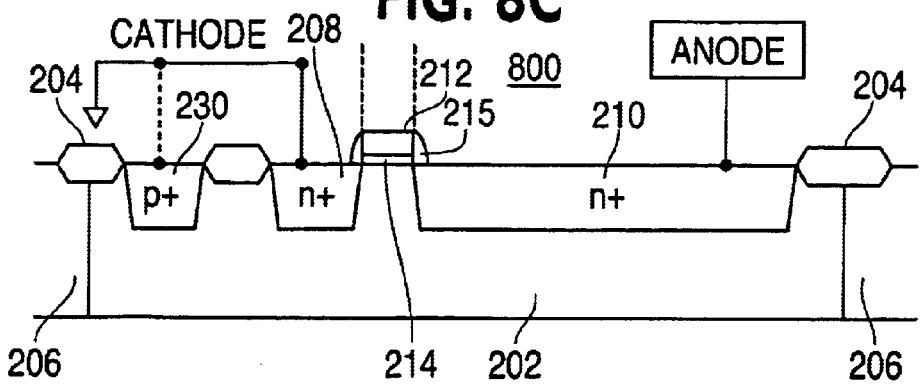

FIGS. 8A–8C illustrate an ESD protection device 800 according to a third embodiment of the present invention. FIG. 8A is a plan view of device 800, while FIGS. 8B and 8C are sections 8B—8B and 8C—8C indicated in FIG. 8A. The features of device 800 are arranged similarly to corresponding features of device 200, including the spacing of current divider segments 240 away from gate 212. However, device 800 additionally includes gate extensions 802 that respectively extend from gate 212 and overlies an end portion of each segment 240.

Figure 9:
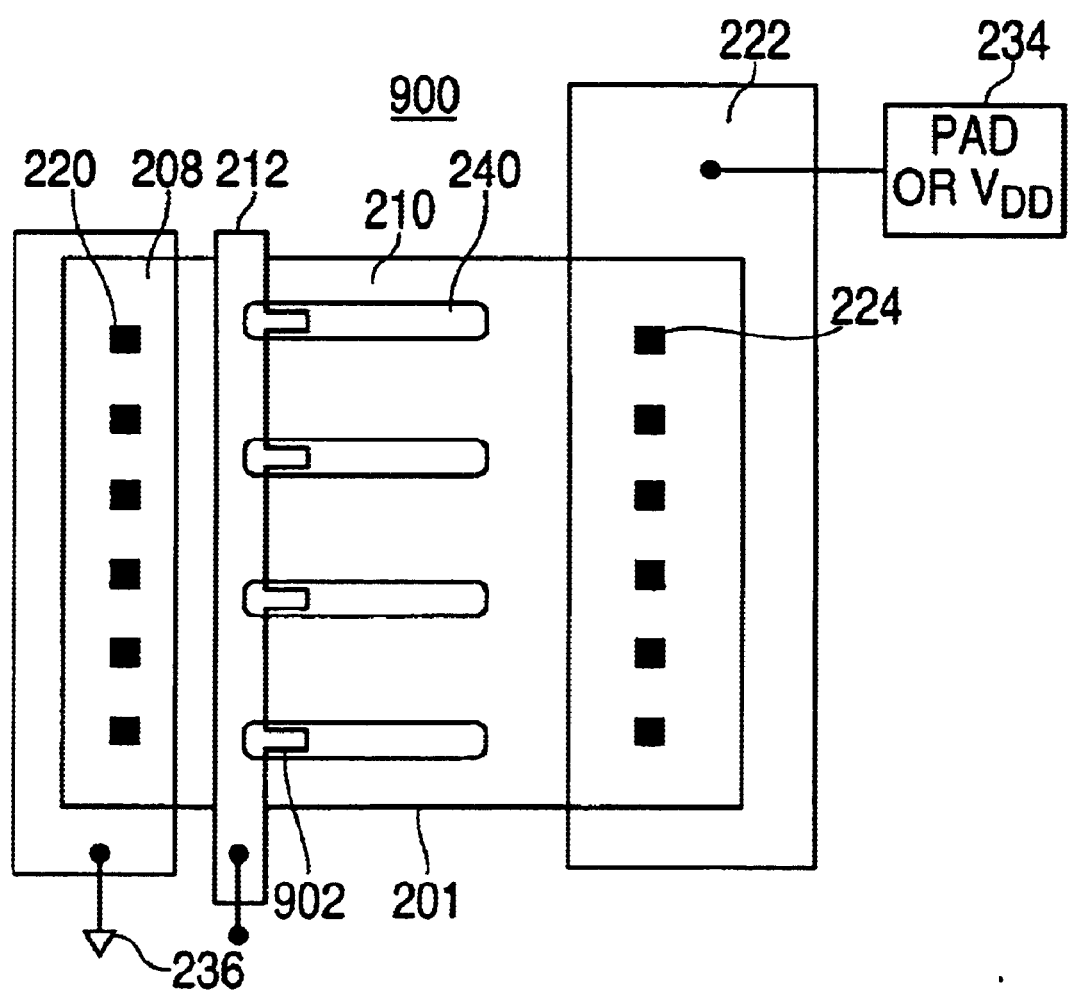
FIG. 9 illustrates a plan view of an ESD protection device that represents an alternate construction of the device illustrated in FIGS. 8A–8C.

FIG. 9 illustrates a plan view of an ESD protection device 900 that represents an alternate construction of device 800. In device 900, each current divider segment 240 extends underneath polysilicon gate 212, while gate extension 902 extends from gate 212 and overlies a portion of each segment 240.

Figure 10A:
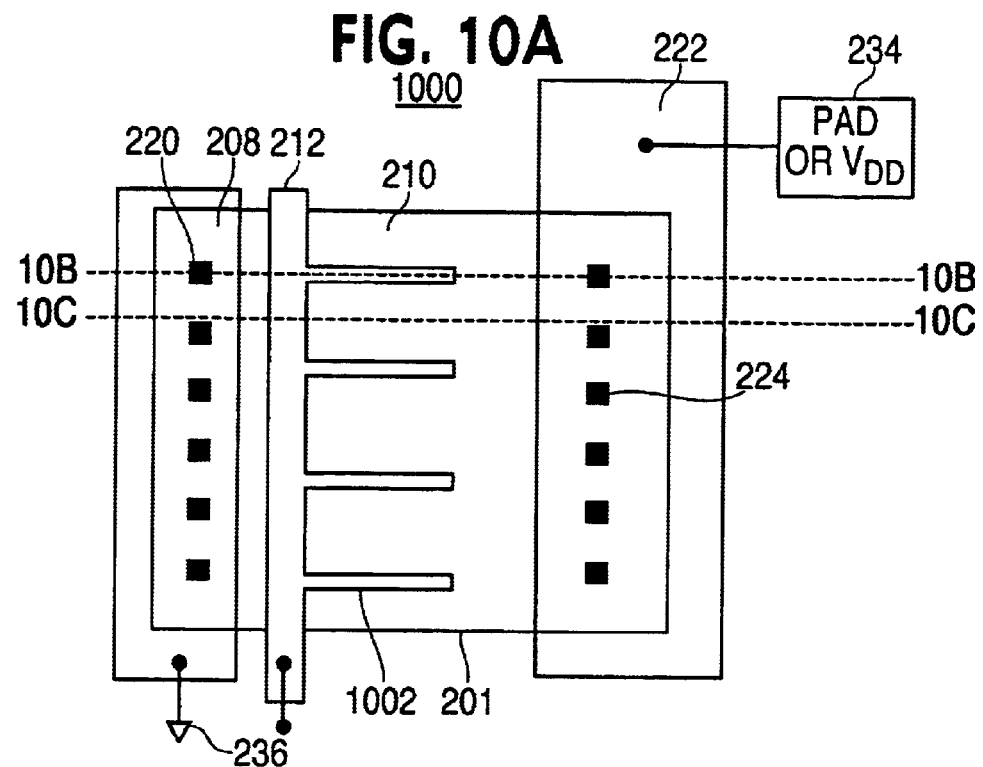
FIGS. 10A–10C illustrate an ESD protection device constructed according to a fourth embodiment of the present invention.
Figure 10B:
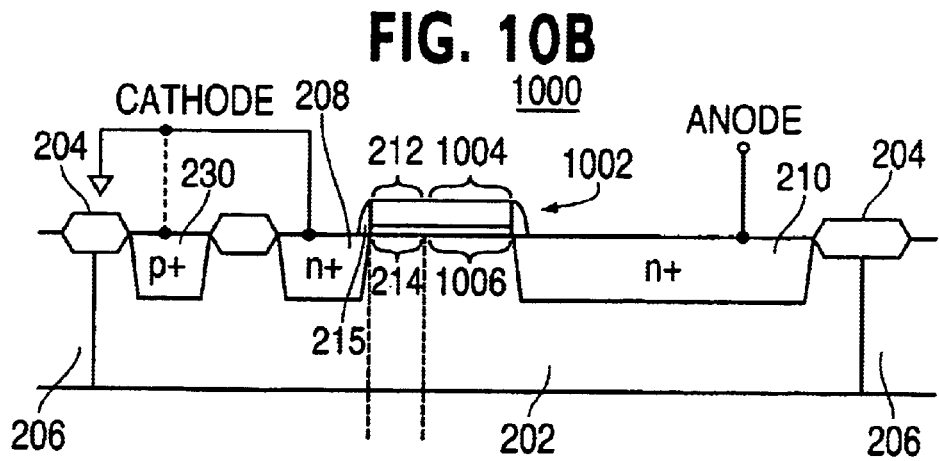
Figure 10C:
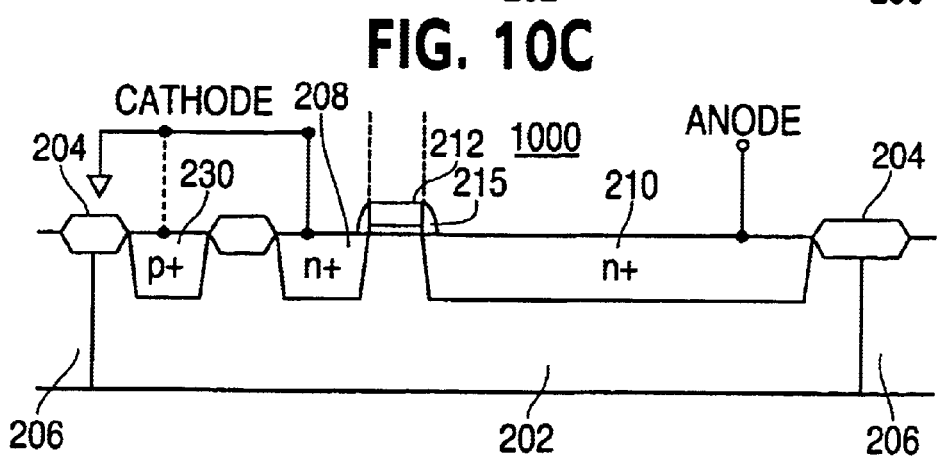

FIGS. 10A–10C illustrate an ESD protection device 1000 according to a fourth embodiment of the present invention. FIG. 10A illustrates a plan view of device 1000 while FIGS. 10B and 10C illustrate sectional views 10B—10B and 10C—10C indicated in FIG. 10A. Device 1000 includes current divider segments 1002 each formed of a polysilicon layer 1004 over a thin oxide layer 1006. Each segment 1002 is contiguous with and extends substantially perpendicularly from gate 212. Thus, as shown in FIGS. 10A and 10B polysilicon layer 1004 is contiguous with the polysilicon of gate 212 and oxide layer 1006 is contiguous with oxide layer 214.

Figure 11A:
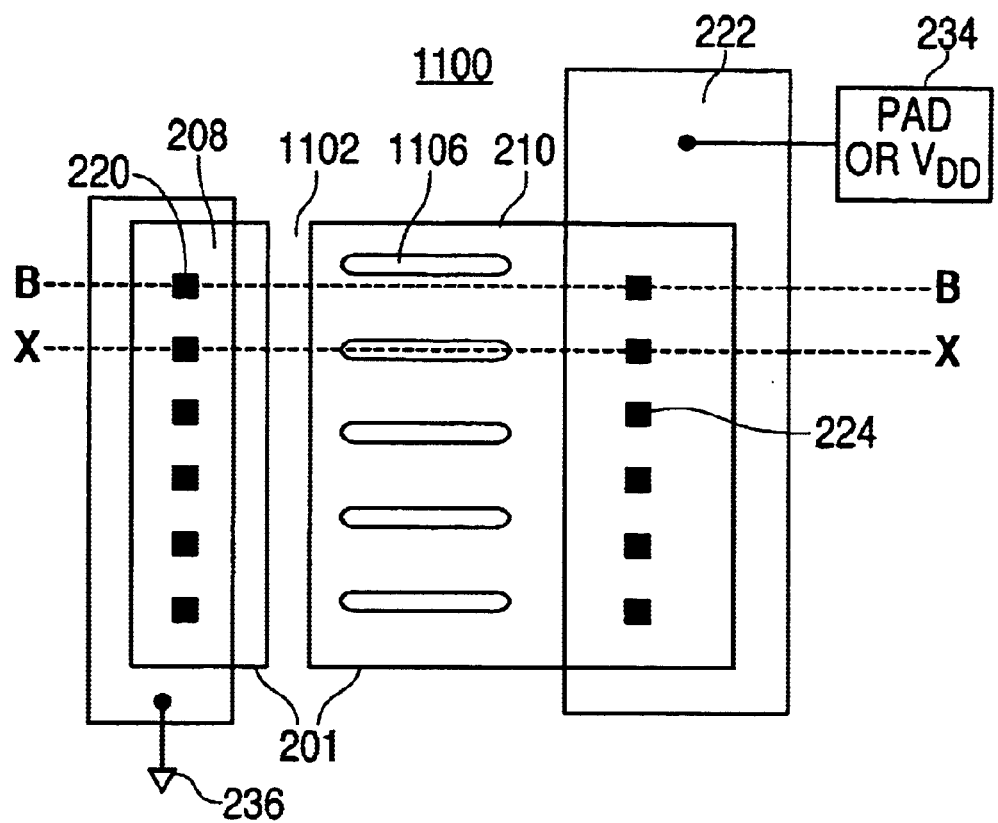
FIGS. 11A–11D illustrate an ESD protection device constructed according to a fifth embodiment of the present invention.
Figure 11B:
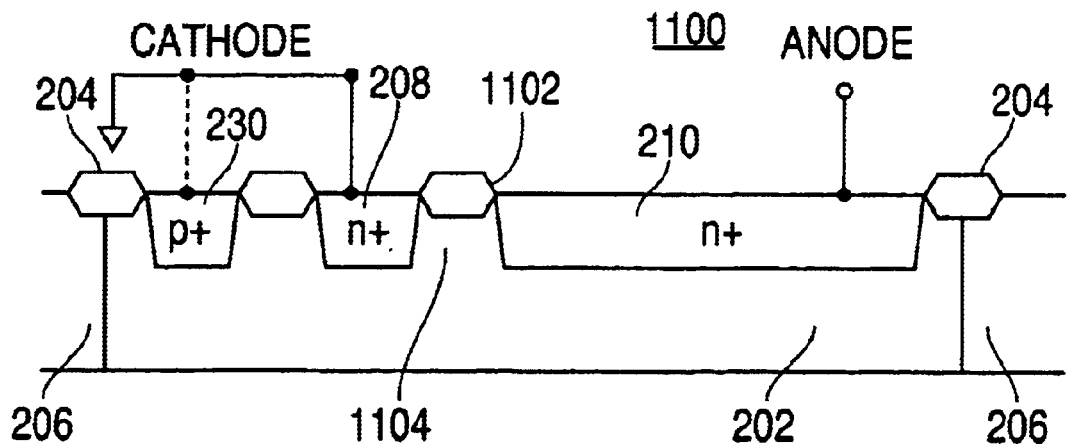
Figure 11C:
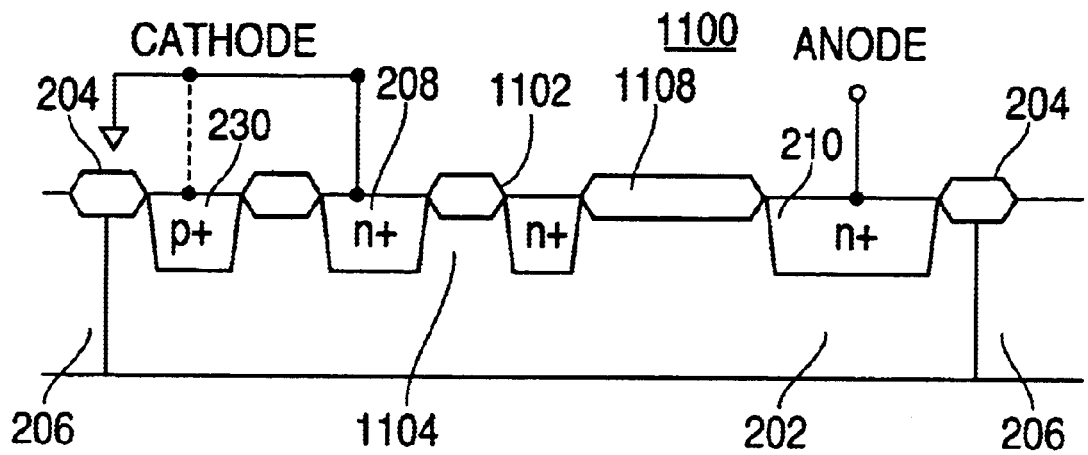
Figure 11D:
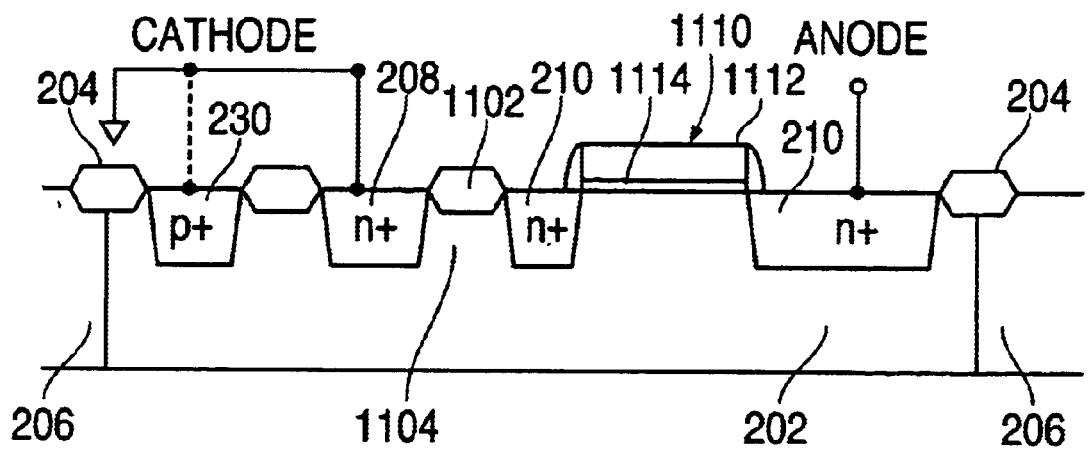

FIGS. 11A–11D illustrate an ESD protection device 1100 according to a fifth embodiment of the present invention. FIG. 11A illustrates a plan view while FIG. 11B illustrates sectional view 11B—11B indicated in FIG. 11A. FIGS. 11C and 11D illustrate sectional view 11X—11X indicated in FIG. 11A and respectively correspond to alternate constructions of device 1100. Device 1100 includes a stripe of field oxide 1102 instead of a polysilicon gate between source region 208 and drain region 210. Field oxide 1102 overlies a channel region 1104 in substrate 202. Device 1100 also includes elongate current divider segments 1106 formed within drain region 210. Segments 1106 can be configured to have the same length and spacing as discussed above for segments 240 of device 200. Segments 1106 can be formed of field oxide segments 1108 as shown in FIG. 11C or as polysilicon segments 1110 as shown in FIG. 11D. Each polysilicon segment 1110 includes a polysilicon layer 1112 over a thin oxide layer 1114.

Device 1100 is configured as an NPN bipolar device with source region 208 and drain region 210 corresponding to the emitter and collector, respectively, and substrate 202 corresponding to the base. When used for ESD protection, the collector serves as the anode and the emitter serves as the cathode. As described above, the anode can be connected to an input, output, I/O pad or a first power bus, while the cathode can be coupled to a second power bus.

While region 230 is not explicitly shown in FIGS. 7A, 7C, 8A, 9, 10A, and 11A, it is typically included, such as shown in sectional views 7B, 8B, 8C, 10B, 10C, and 11B–11D.

Figure 12A:
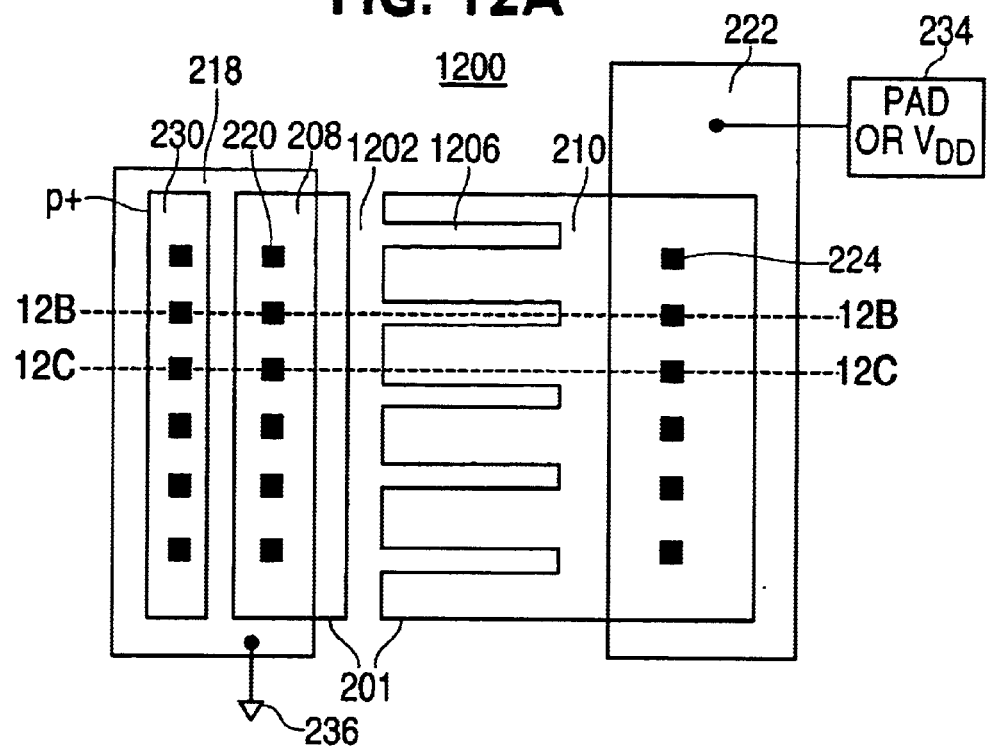
FIGS. 12A–12C illustrate an ESD protection device constructed according to a sixth embodiment of the present invention.
Figure 12B:
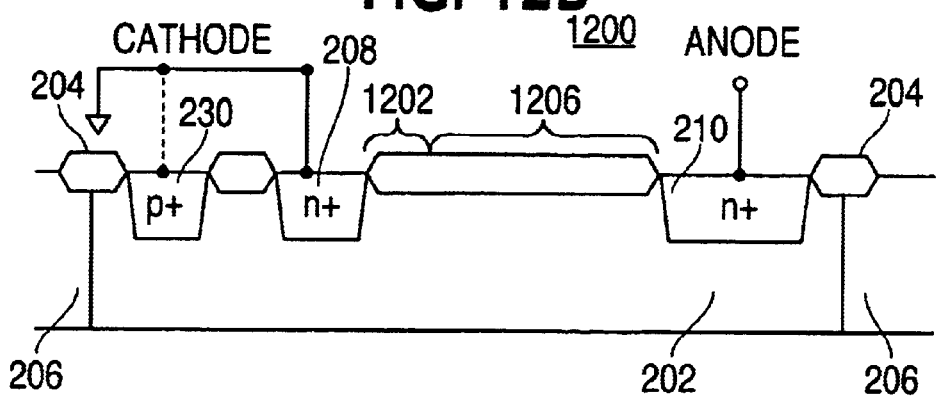
Figure 12C:
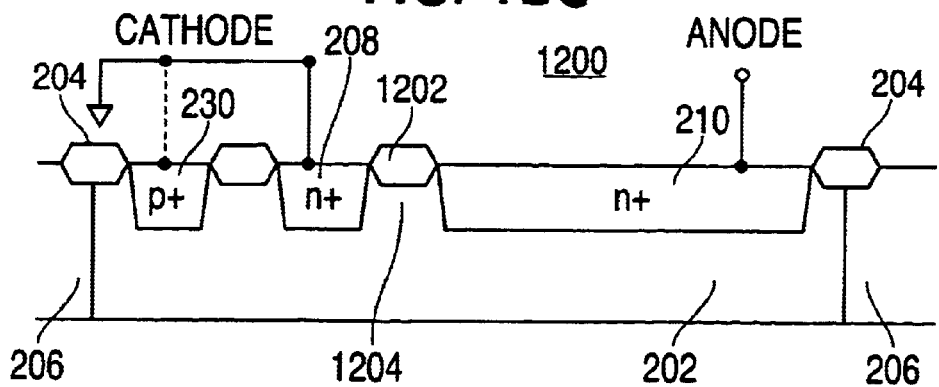

FIGS. 12A–12C illustrate an ESD protection device 1200 according to a sixth embodiment of the present invention. FIG. 12A illustrates a plan view, while FIGS. 12B and 12C illustrate sectional views 12B—12B and 12C—12C indicated in FIG. 12A. Device 1200 includes a stripe of field oxide 1202 instead of a polysilicon gate between source region 208 and drain region 210. Field oxide 1202 overlies a channel region 1204 in substrate 202. Device 1200 also includes elongate current divider segments 1206 each formed of field oxide. Each segment 1206 is contiguous with and extends substantially perpendicularly from oxide 1202.

Device 1200, like device 1100, is configured as an NPN bipolar device with source region 208 and drain region 210 corresponding to the emitter and collector, respectively, and substrate 202 corresponding to the base.

FIGS. 13–23 illustrate further embodiments of ESD protection devices constructed according to the present invention. Each of the devices illustrated in FIGS. 13–23 include two gates, or gate fingers, connected to and extending from a polysilicon or metal interconnect. In practice, such devices would preferably be constructed to include an even number of gates, e.g., 2, 4, 6, etc., gates, with a common drain region between each pair of gates and the outermost portions of the diffusion region adjacent the outermost gates serving as source regions. Device 600 in FIG. 6 is an example of such a multigate configuration. The ESD protection devices 200–1000 while illustrated as each containing a single gate can also be implemented with a multiple gate architecture. Such devices are useful as ESD protection devices with either a single gate or multiple gate architecture.

Figure 13:
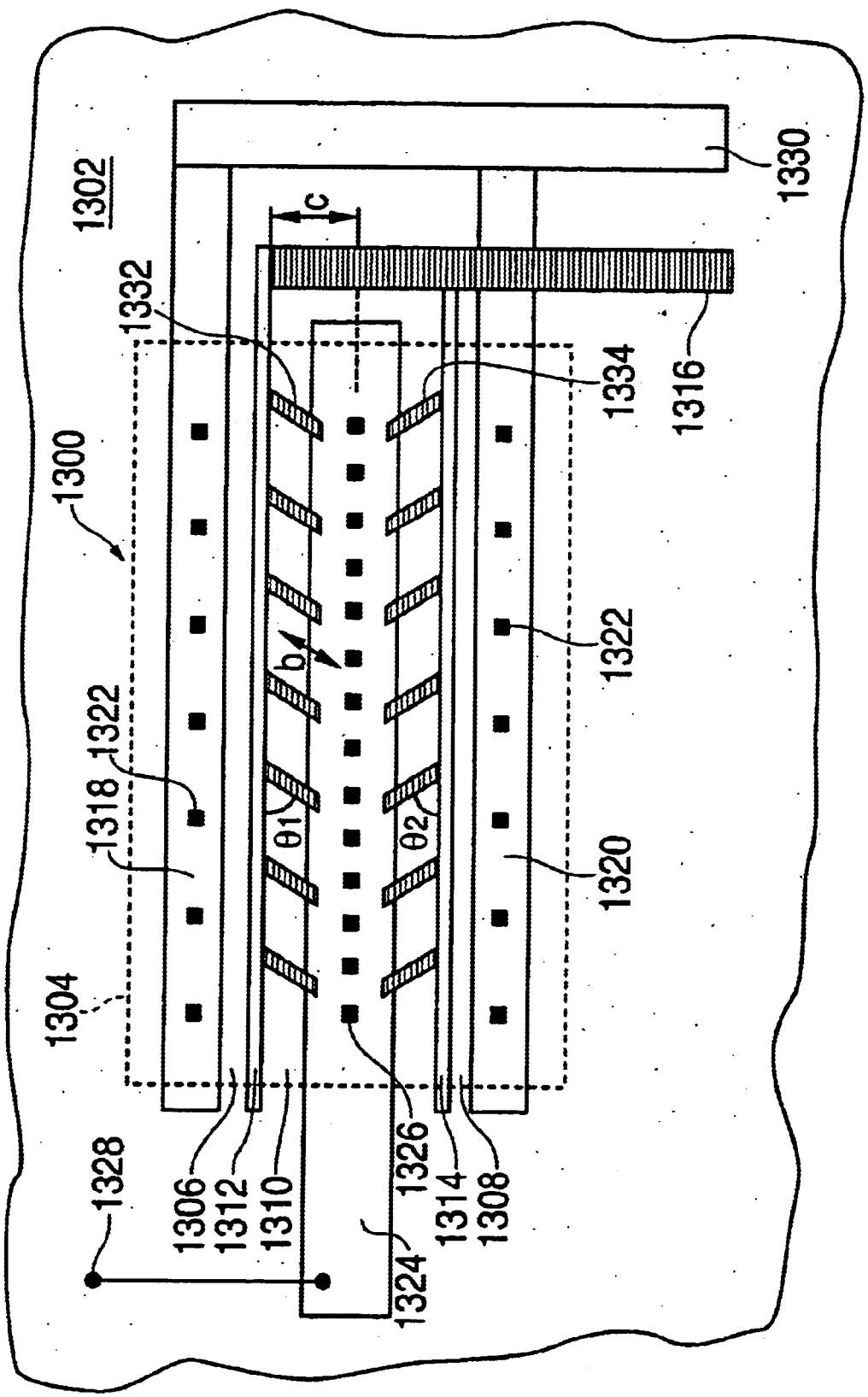
FIG. 13 illustrates an ESD protection device constructed according to a seventh embodiment of the present invention.

FIG. 13 illustrates an ESD protection device 1300 according to a seventh embodiment of the present invention. Device 1300 is formed in a p-type silicon substrate 1302 and includes a region 1304 in which are formed N+ source diffusion regions 1306 and 1308 and an N+ drain diffusion region 1310. Region 1304 defines the boundaries of the source and drain diffusion regions. Region 1304 is surrounded by a field oxide (not shown). Polysilicon gates 1312 and 1314 are interconnected by a polysilicon or metal interconnect 1316. Gate 1312 is positioned over a channel region between diffusion regions 1306 and 1310 and gate 1314 is positioned over a channel region between diffusion regions 1308 and 1310. Metal bus layers 1318 and 1320 respectively overlie source diffusion regions 1306 and 1308 and are connected thereto by source contacts 1322. A metal bus layer 1324 overlies drain diffusion region 1310 and is connected thereto by drain contacts 1326.

Device 1300 is connected between an anode 1328 and a cathode 1330. Anode 1328 is connected to metal layer 1324 and cathode 1330 is connected to metal layers 1318 and 1320. Anode 1328 can, in turn, be coupled to an input, output, I/O pad, or a first power bus. Cathode 1328 can be coupled to another IC pad or to a second power bus, e.g., to a reference or ground bus.

Device 1300 further includes a row of elongate polysilicon current divider segments 1332 and a row of elongate polysilicon current divider segments 1334. Each segment 1332 is formed within drain diffusion region 1310 and extends between gate 1312 and the region of drain contacts 1326 and under metal layer 1324. Similarly, each segment 1334 is formed within drain diffusion region 1310 and extends between gate 1314 and the region of contacts 1326. Further, one end of each segment 1332 is connected to gate 1312 and one end of each segment 1334 is connected to gate 1314. These connections are achieved by forming gates 1312 and 1314 and segments 1332 and 1334 in the same process steps. The opposite end of each of segments 1332 and 1334 terminates within the drain-side active region and spaced from drain contacts 1326.

Each of segments 1332 is skewed relative to gate 1312 at an acute angle $\Theta_1$ of, for example, 30°, 45°, or 60°. Segments 1332 are preferably all skewed at the same angle so they are parallel to each other. Similarly, each of segments 1334 is skewed relative to gate 1314 at an acute angle $\Theta_2$ which is, preferably, the same as the angle $\Theta_1$, at which segments 1332 are skewed. Optionally, segments 1332 can be uniformly spaced and segments 1334 are disposed in a one-to-one correspondence with segments 1332. As another option, the respective skews of segments 1330 and 1332 can be oriented relative to gate 1312 and 1314 so that the arrangement of segments of 1332 is symmetrical with respect to the arrangement of segments 1334.

During an ESD event, with segments 1332 and 1334 arranged as described above, each adjacent pair of segments 1332 or 1334 defines a current path for current flow between source contacts 1320 and drain contacts 1326.

Figure 14:
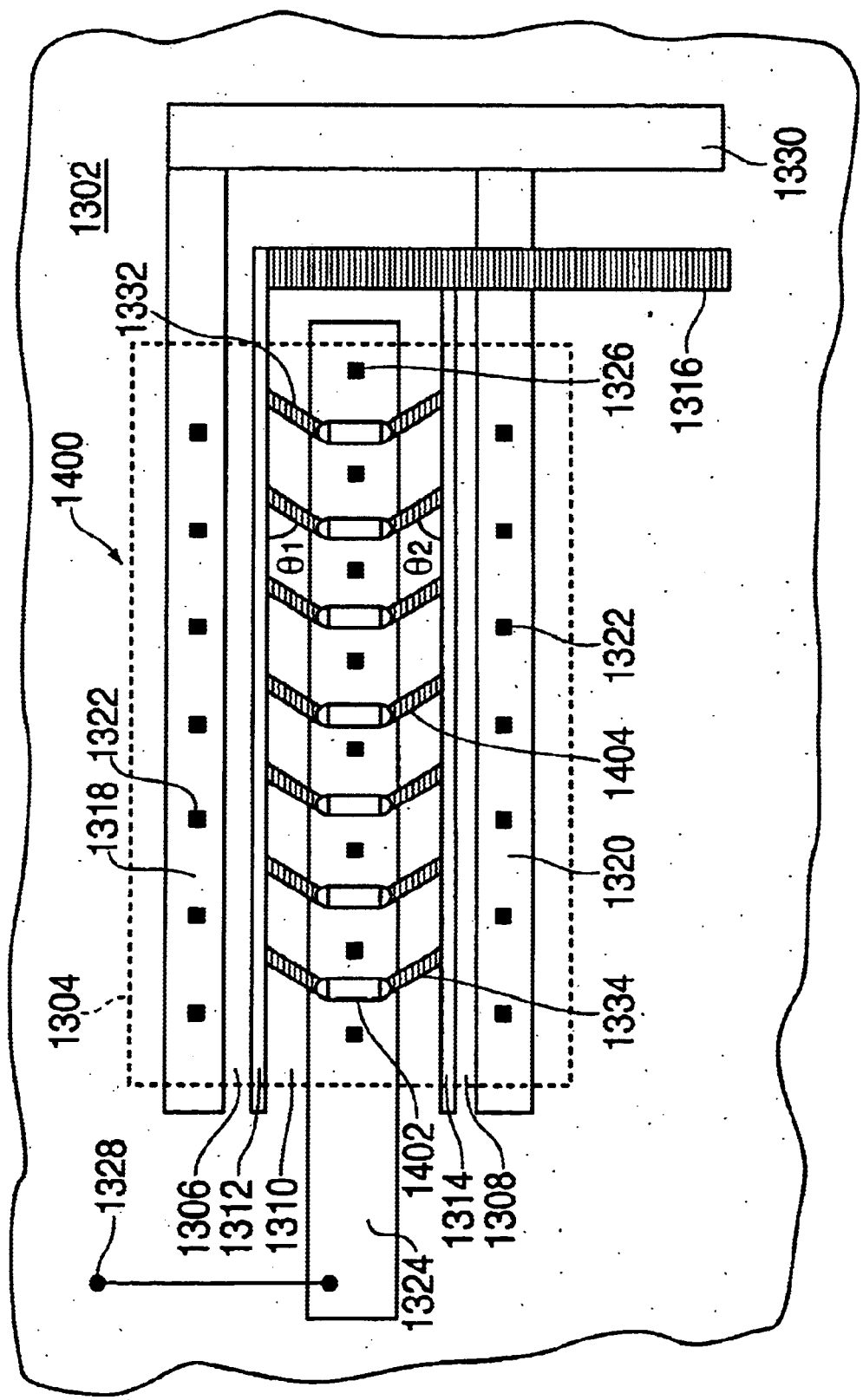
FIG. 14 illustrates an ESD protection device constructed according to a eighth embodiment of the present invention.

FIG. 14 illustrates an ESD protection device 1400 according to a eighth embodiment of the present invention. With reference FIG. 14, device 1400 differs from device 1300 by inclusion of field oxide segments 1402 that respectively interconnect corresponding pairs of segments 1332 and 1334. Each segment 1402 is formed in drain diffusion region 1310 and is positioned between adjacent drain contacts 1326. As a result, each connected set of corresponding segments 1332 and 1334 and segment 1402 forms a single current divider structure 1404. Further, each pair of adjacent current divider structures 1404 defines a current path for current flow between source contacts 1322 and drain contacts 1326 during an ESD event. Structures 1404 therefore fully segment drain region 1310. Use of field oxide segment 1402 to join segments 1332 and 1334 instead of a polysilicon segment on thin oxide segment, obviates the possibility of damage that may otherwise occur to the thin oxide resulting from high current densities and heating due to proximity to drain contacts 1326.

Figure 15:
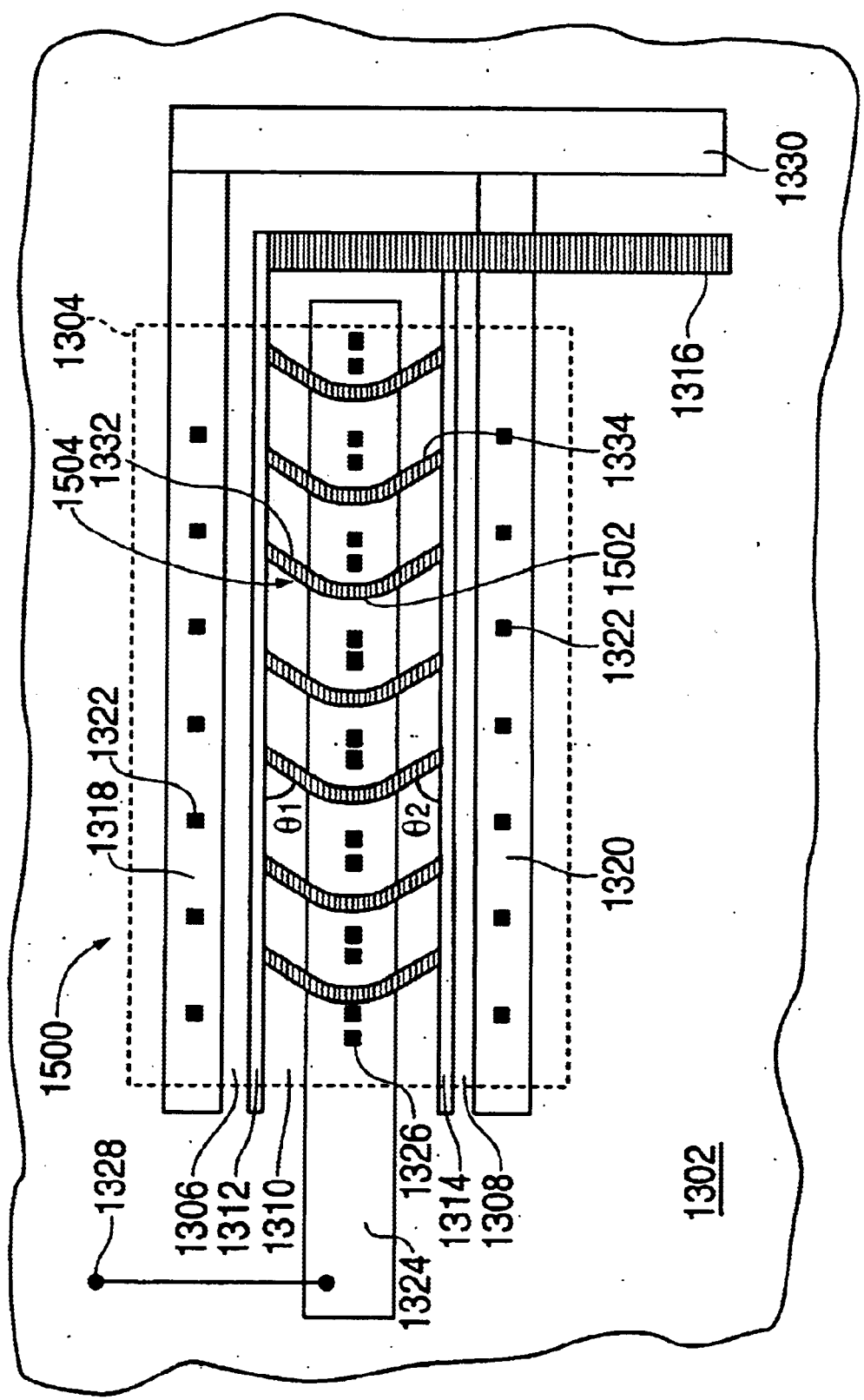
FIG. 15 illustrates an ESD protection device constructed according to a ninth embodiment of the present invention.

FIG. 15 illustrates an ESD protection device 1500 according to a ninth embodiment of the present invention. Device 1500 differs from device 1300 by providing a further polysilicon current divider segment 1502 that connects each pair of segments 1332 and 1334 to provide a contiguous polysilicon current divider segment 1504. Since each of segments 1332 and 1334 is connected to gates 1312 and 1314, respectively, current divider segments 1504 fully divide drain diffusion region 1310.

Figure 16:
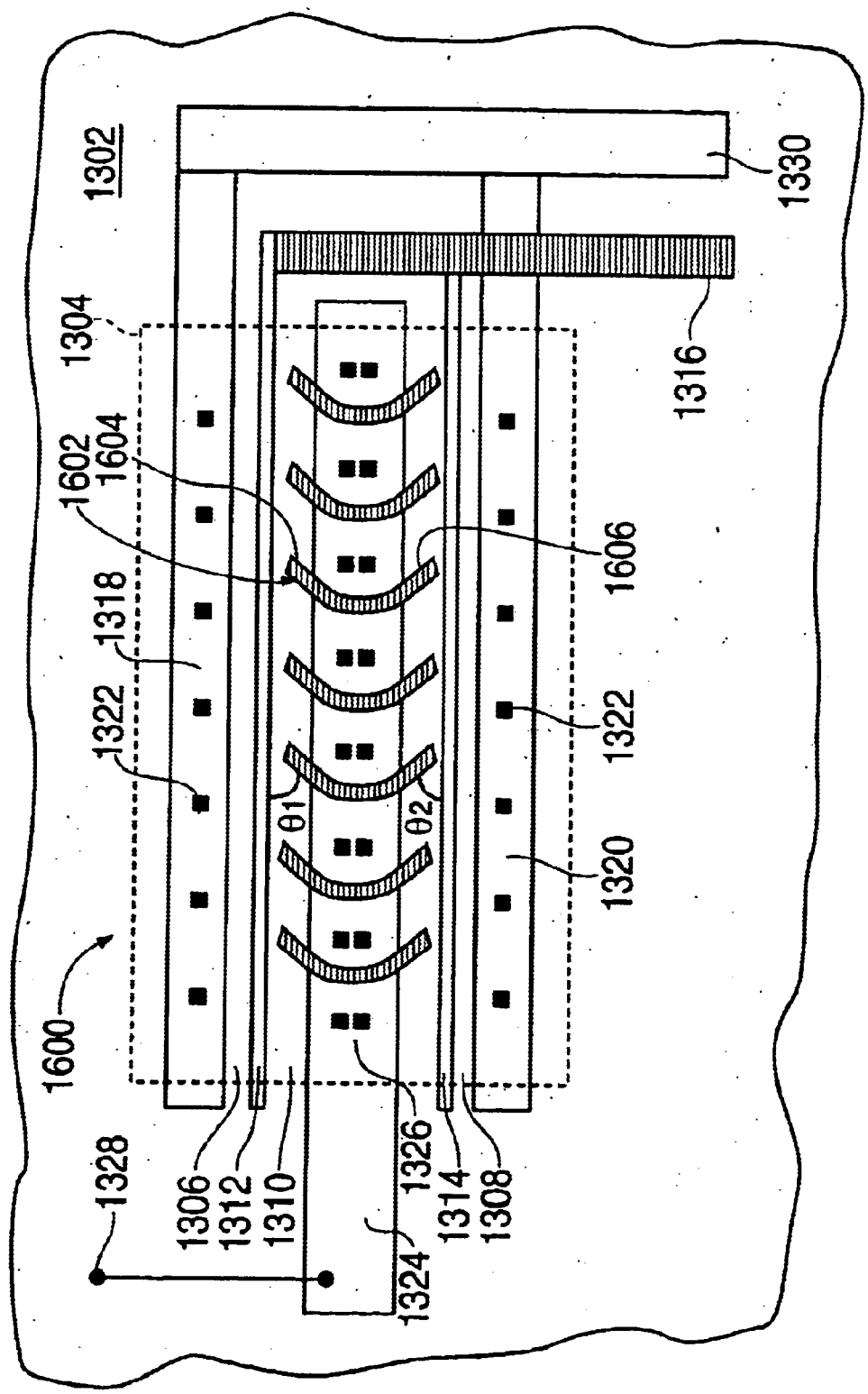
FIG. 16 illustrates an ESD protection device constructed according to a tenth embodiment of the present invention.

FIG. 16 illustrates an ESD protection device 1600 according to a tenth embodiment of the present invention. Device 1600 includes polysilicon current divider segments 1602 that are substantially parallel to each other and evenly spaced across drain diffusion region 1310. Each segment 1602 includes a first portion 1604 extending toward gate 1312, but not connected thereto, and a second portion 1606 extending toward gate 1314, but not connected thereto. Each segment 1602 extends under metal layer 1324, is insulated therefrom by a dielectric layer (not shown) and is positioned between adjacent drain contacts 1326. Each portion 1604 is skewed relative to gate 1312 by angle $\Theta_1$ and each portion 1606 is skewed relative to gate 1314 by angle $\Theta_2$. Each of $\Theta_1$, and $\Theta_2$ is an acute angle of, for example, 140°, 155°, or 60°. Preferably, $\Theta_1$ is equal to $\Theta_2$. Since each segment 1602 is not connected to either of gates 1312 or 1314, segments 1602 partially divide drain diffusion region 1310.

Figure 17:
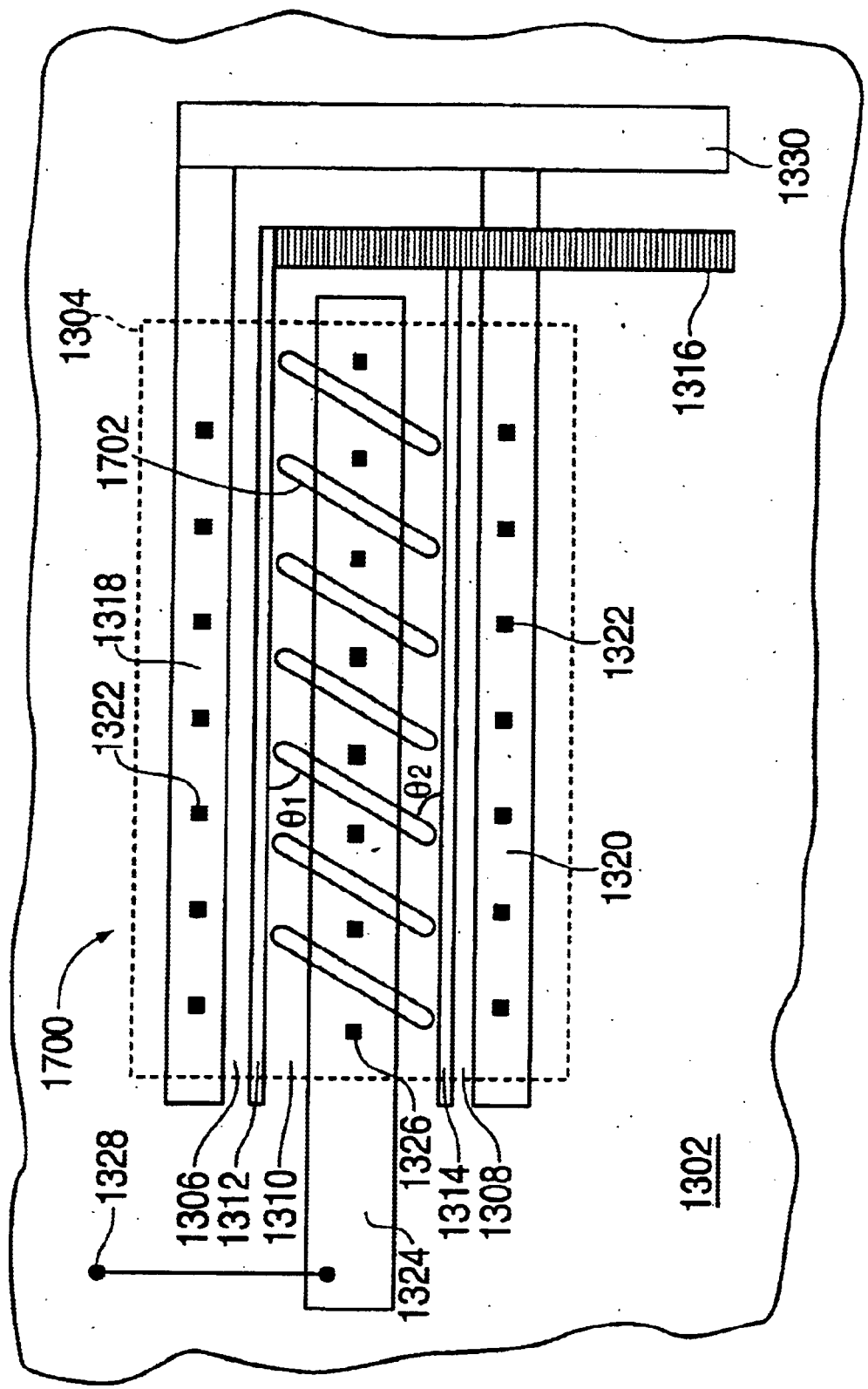
FIG. 17 illustrates an ESD protection device constructed according to a eleventh embodiment of the present invention.

FIG. 17 illustrates an ESD protection device 1700 according to a eleventh embodiment of the present invention. Device 1700 includes field oxide current divider segments 1702 that are substantially parallel to each other and evenly spaced across drain diffusion region 1310. Each segment 1702 extends under metal layer 1324, is insulated therefrom by a dielectric layer (not shown) and is positioned between adjacent drain contacts 1326. The respective ends of each segment 1702 extend toward but are not connected to gates 1312 and 1314. Each segment 1702 is substantially straight as shown in FIG. 17 and skewed relative to gates 1312 and 1314 by angle $\Theta_1$. Since each segment 1702 is not connected to either of gates 1312 or 1314, segments 1702 partially divide drain diffusion region 1310.

Figure 18:
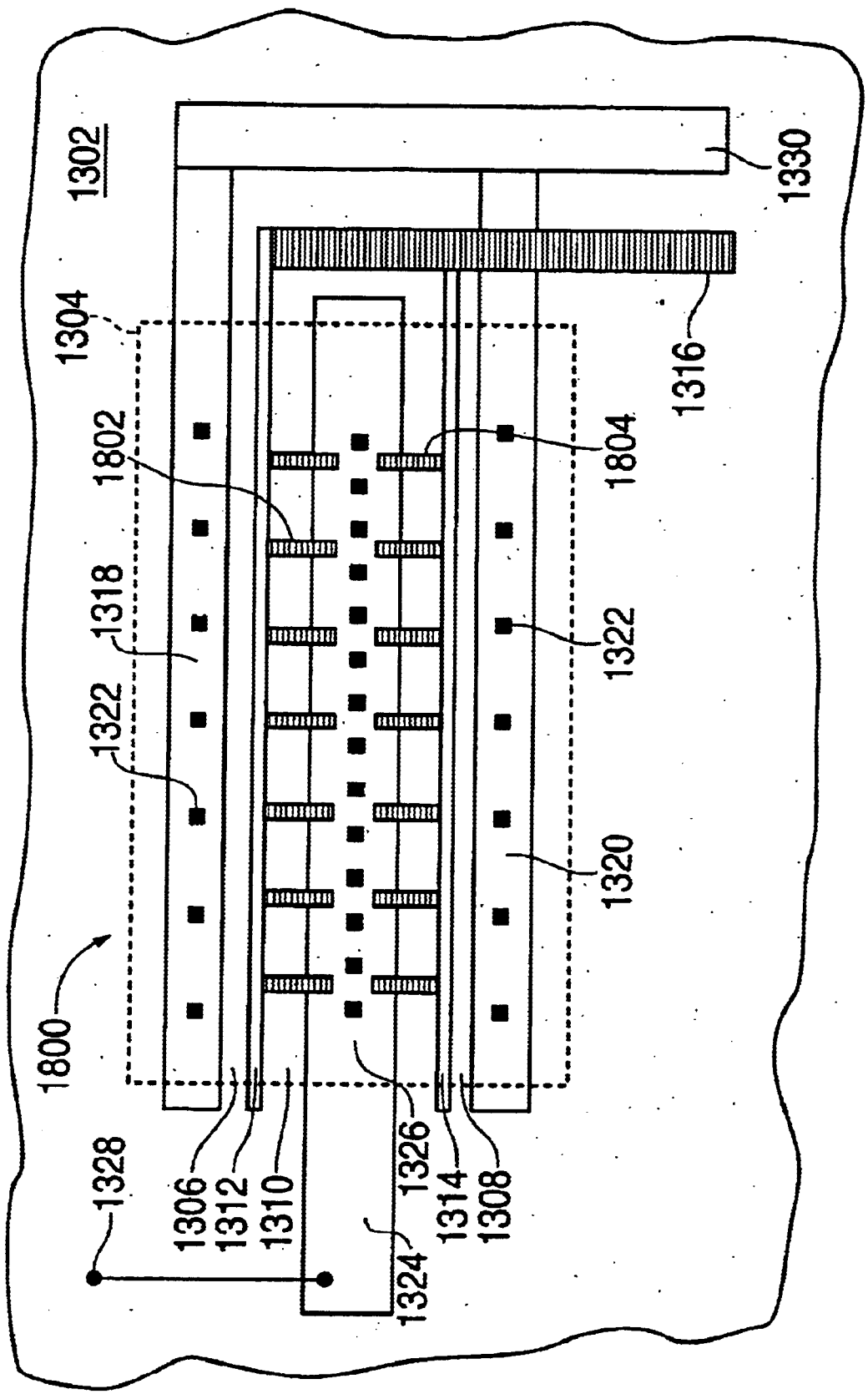
FIG. 18 illustrates an ESD protection device constructed according to a twelfth embodiment of the present invention.

FIG. 18 illustrates an ESD protection device 1800 according to a twelfth embodiment of the present invention. Device 1800 differs from device 1300 by including polysilicon current divider segments 1802 and 1804 that are substantially perpendicular to gates 1312 and 1314. Segments 1802 and 1804 are connected to gates 1312 and 1314, respectively. Segments 1802 and 1804 are evenly spaced across drain diffusion region 1310 and each segment 1802 aligns with an associated segment 1804. The free end of each segment 1802, i.e., remote from gate 1312, extends into the region of drain contacts 1326 and under metal layer 1324. Similarly, the free end of each segment 1804, i.e., remote from gate 1314, extends into the region of drain contacts 1326 and under metal layer 1324. Further, each pair of associated segments 1802 and 1804 are positioned such that their free ends are maintained at a distance of at least 0.5 $\mu$m and, preferably 1–4.5 $\mu$m from the nearest drain contacts 1326. As in the case of device 1300, each adjacent pair of segments 1802 or 1804 defines a current path for current flow between source contacts 1320 and drain contacts 1326 during an ESD event.

Figure 19:
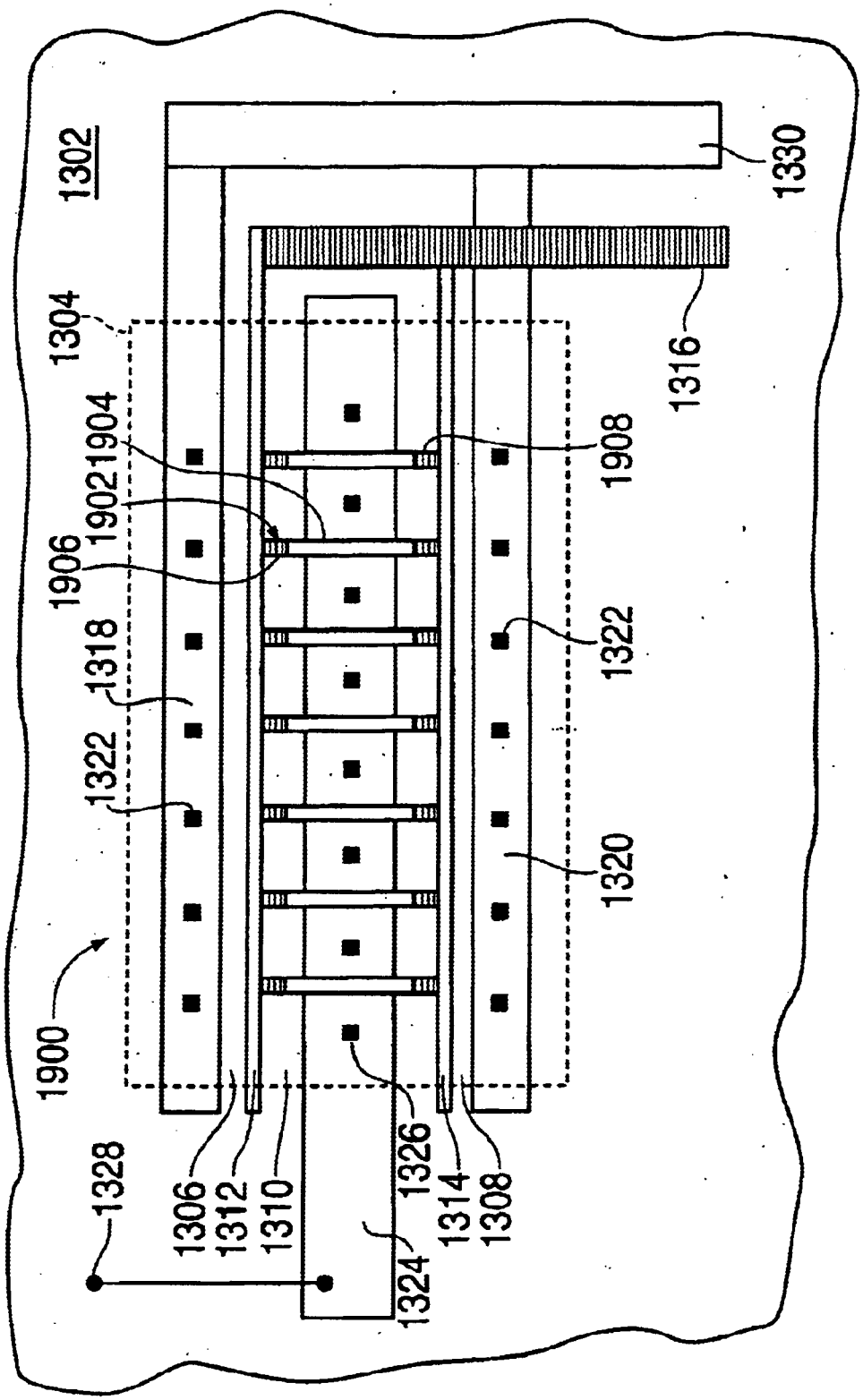
FIG. 19 illustrates an ESD protection device constructed according to a thirteenth embodiment of the present invention.

FIG. 19 illustrates an ESD protection device 1900 according to a thirteenth embodiment of the present invention. Device 1900 includes current divider segments 1902 formed within drain diffusion region 1310 that are substantially parallel to each other and evenly spaced across drain diffusion region 1310. Each segment 1902 includes a field oxide segment 1904 and polysilicon segments 1906 and 1908 that extend from opposite ends of segment 1904. Each polysilicon segment 1906 is connected to gate 1312 and each polysilicon segment 1908 is connected to gate 1314. Each segment 1902 is substantially perpendicular to gates 1312 and 1314 and positioned between adjacent drain contacts 1326. Each field oxide segment 1904 is positioned under and insulated from metal layer 1324 by a dielectric layer (not shown). Since each segment 1902 extends between and is connected to gates 1312 and 1314, segments 1902 fully divide drain diffusion region 1310.

Figure 20:
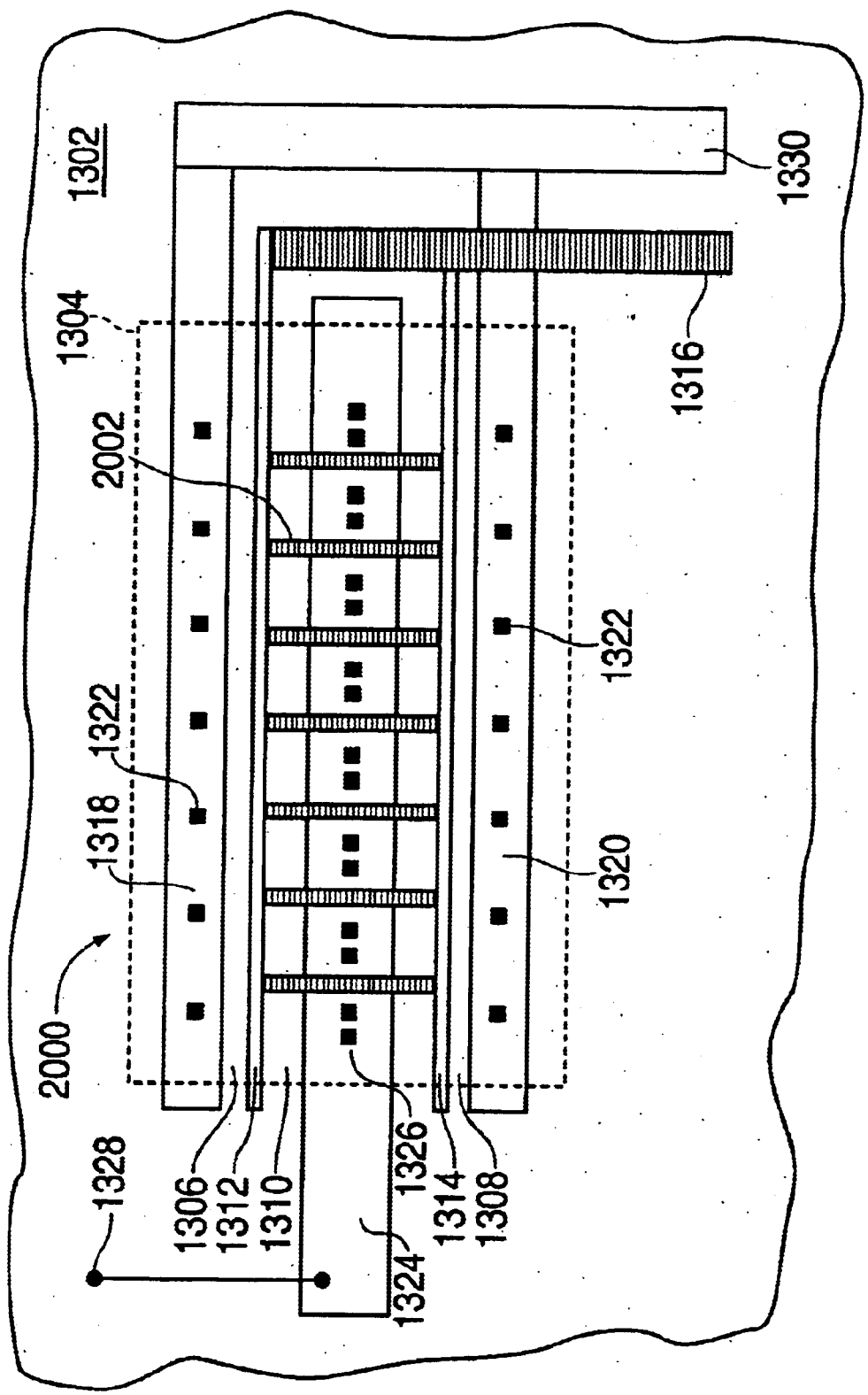
FIG. 20 illustrates an ESD protection device constructed according to a fourteenth embodiment of the present invention.

FIG. 20 illustrates an ESD protection device 2000 according to an fourteenth embodiment of the present invention. Device 2000 includes polysilicon current divider segments 2002 formed within drain diffusion region 1310 that are substantially parallel to each other and evenly spaced across drain diffusion region 1310. The opposite ends of each segment 2002 are connected to gates 1312 and 1314. Each segment 2002 is substantially perpendicular to gates 1312 and 1314 and positioned between adjacent drain contacts 1326. Each segment 2002 is positioned under and insulated from metal layer 1324 by a dielectric layer (now shown). Since each segment 2002 extends between and is connected to gates 1312 and 1314, segments 2002 fully divide drain diffusion region 1310.

Figure 21:
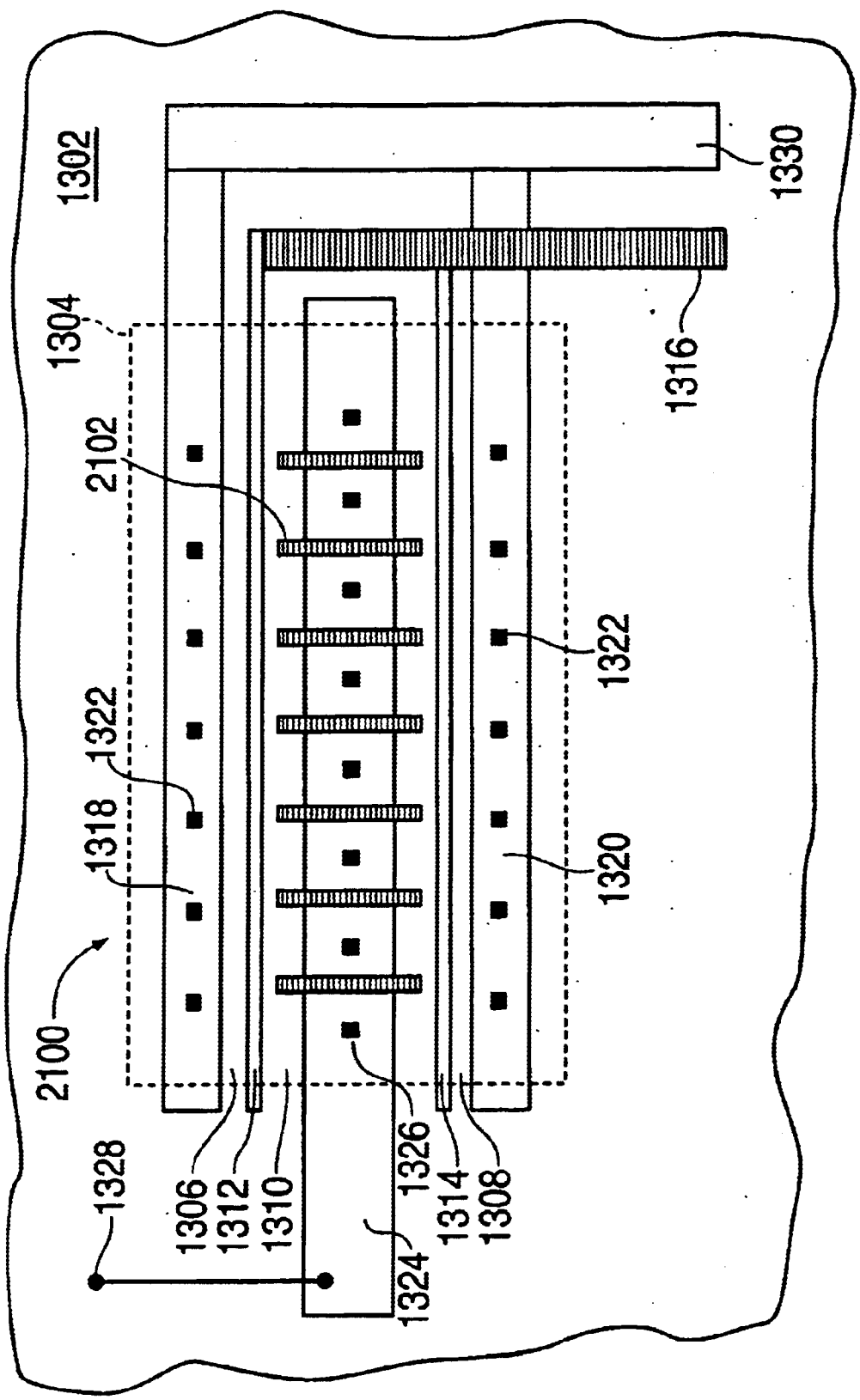
FIG. 21 illustrates an ESD protection device constructed according to a fifteenth embodiment of the present invention.

FIG. 21 illustrates an ESD protection device 2100 according to a fifteenth embodiment of the present invention. Device 2100 includes polysilicon current divider segments 2102 formed within drain diffusion region 1310, that are substantially parallel to each other and evenly spaced across drain diffusion region 1310. The opposite ends of each segment 2102 are spaced from, i.e., not connected to, gates 1312 and 1314. Each segment 2102 is oriented substantially perpendicular to gates 1312 and 1314 and positioned between adjacent drain contacts 1326. Each segment 2102 is positioned under and insulated from metal layer 1324 by a dielectric layer (not shown). Since each segment 2102 is not connected to either of gates 1312 or 1314, segments 2102 partially divide drain diffusion region 1310.

Figure 22:
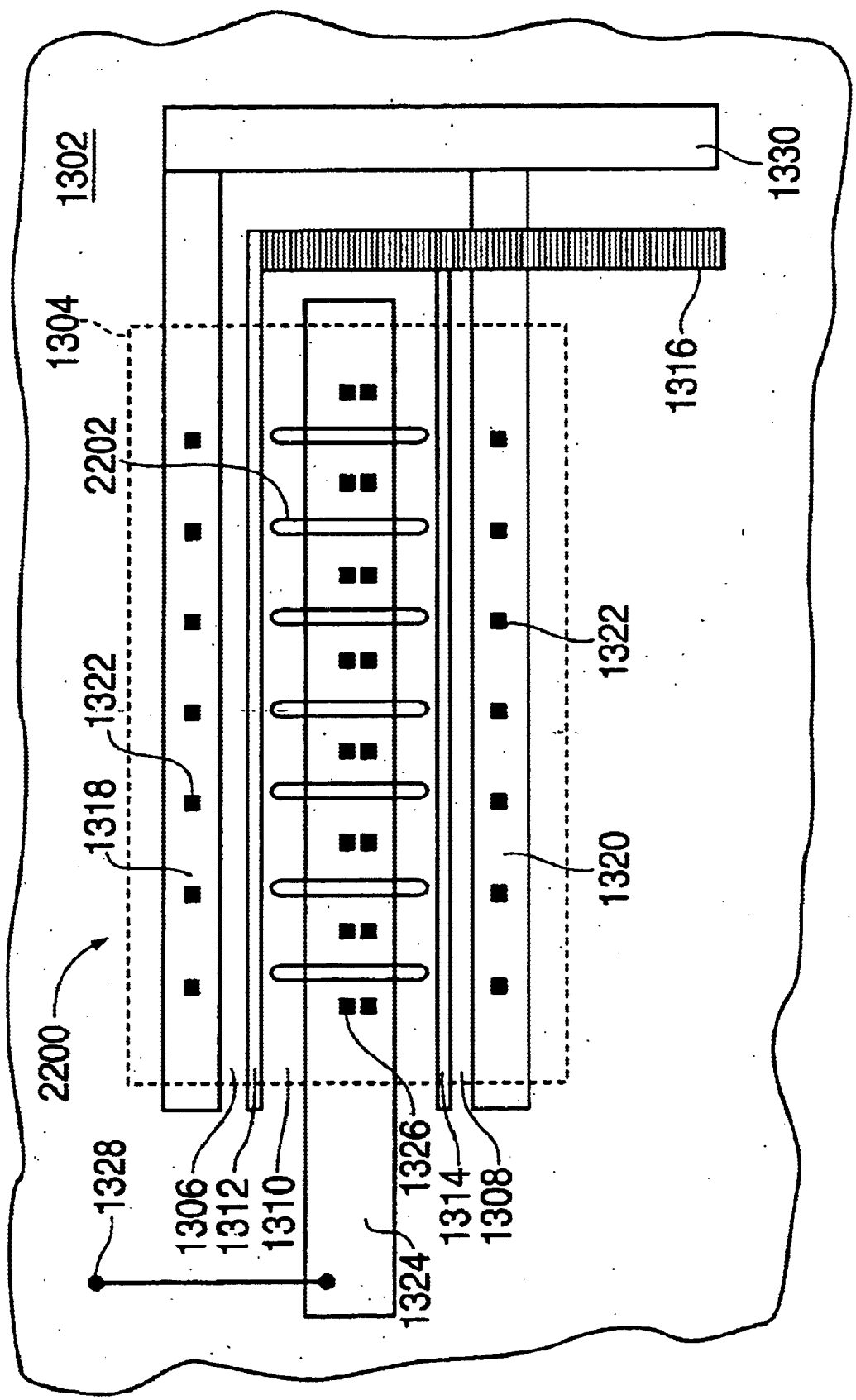
FIG. 22 illustrates an ESD protection device constructed according to a sixteenth embodiment of the present invention.

FIG. 22 illustrates an ESD protection device 2200 according to a sixteenth embodiment of the present invention. Device 2200 includes field oxide current divider segments 2202 formed within drain diffusion region 1310 that are substantially parallel to each other and evenly spaced across drain diffusion region 1310. Each segment 2202 extends under metal layer 1324 and is insulated therefrom by a dielectric layer (not shown). Each segment 2202 is positioned between adjacent drain contacts 1326. The respective ends of each segment 2202 extend toward but are not connected to gates 1312 and 1314. Each segment 2202 is substantially straight as shown in FIG. 22 and oriented to be substantially perpendicular to gates 1312 and 1314. Since each segment 2202 is not connected to either of gates 1312 or 1314, segments 2202 partially divide drain diffusion region 1310.

Figure 23:
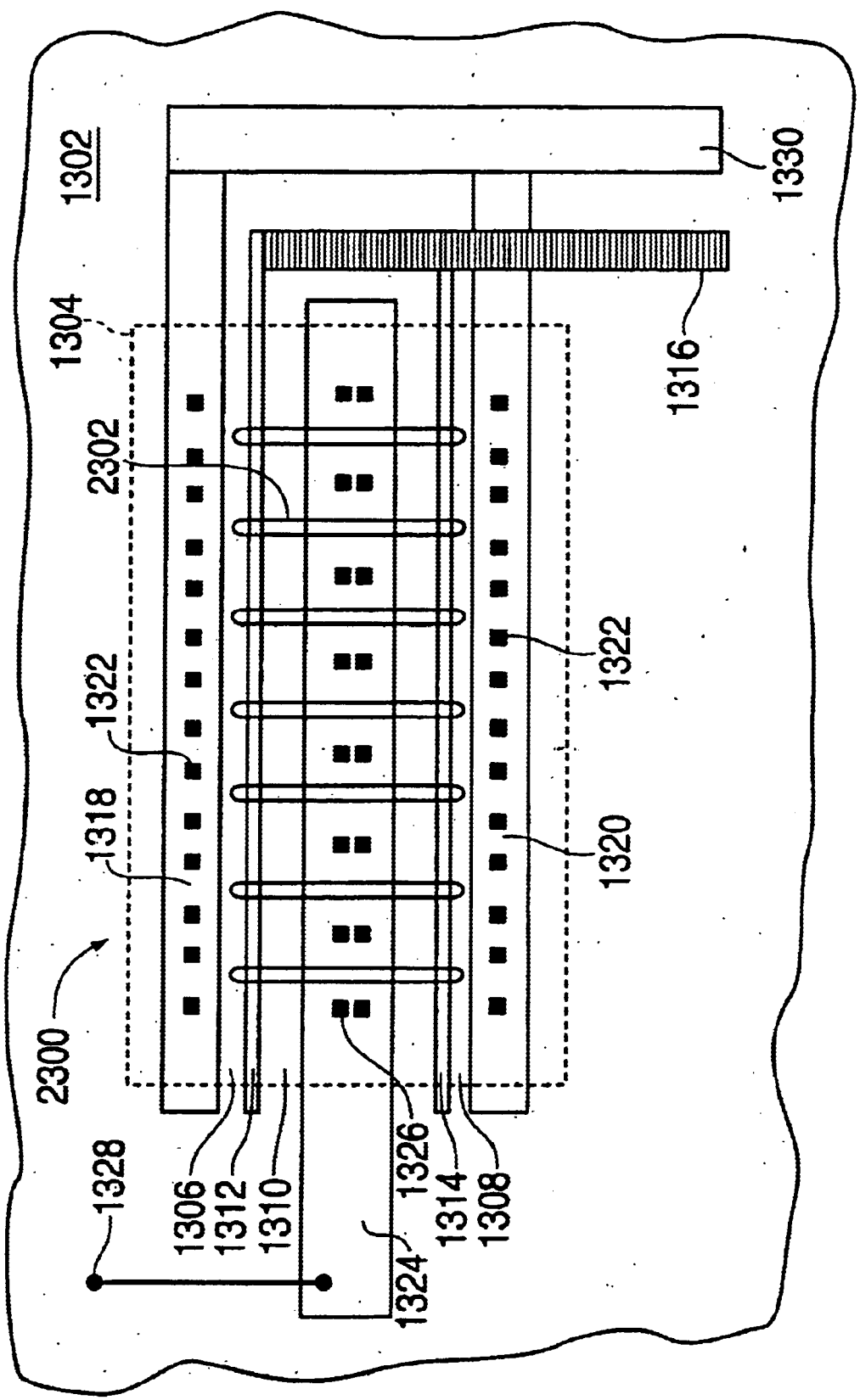
FIG. 23 illustrates an ESD protection device constructed according to an seventeenth embodiment of the present invention.

FIG. 23 illustrates an ESD protection device 2300 according to a seventeenth embodiment of the present invention. Device 2300 includes field oxide current divider segments 2302 formed within drain diffusion region 1310 that are substantially parallel to each other and evenly spaced across drain diffusion region 1310. Each segment 2302 extends under metal layer 1324 and is insulated therefrom by a dielectric layer (not shown). Each segment 2302 is substantially straight as shown in FIG. 23 and oriented to be substantially perpendicular to gates 1312 and 1314. Since each segment 2302 extends beyond gates 1312 and 1314, segments 2302 fully segment drain diffusion region 1310. Each pair of drain contacts 1326 can be arranged parallel to segments 2302 to increase the spacing therefrom. This arrangement reduces current densities while keeping a minimum spacing between contacts 1326 and adjacent segment 2302. This minimum spacing can be 0.5 $\mu$m or larger, without degrading ESD performance.

Figure 24:
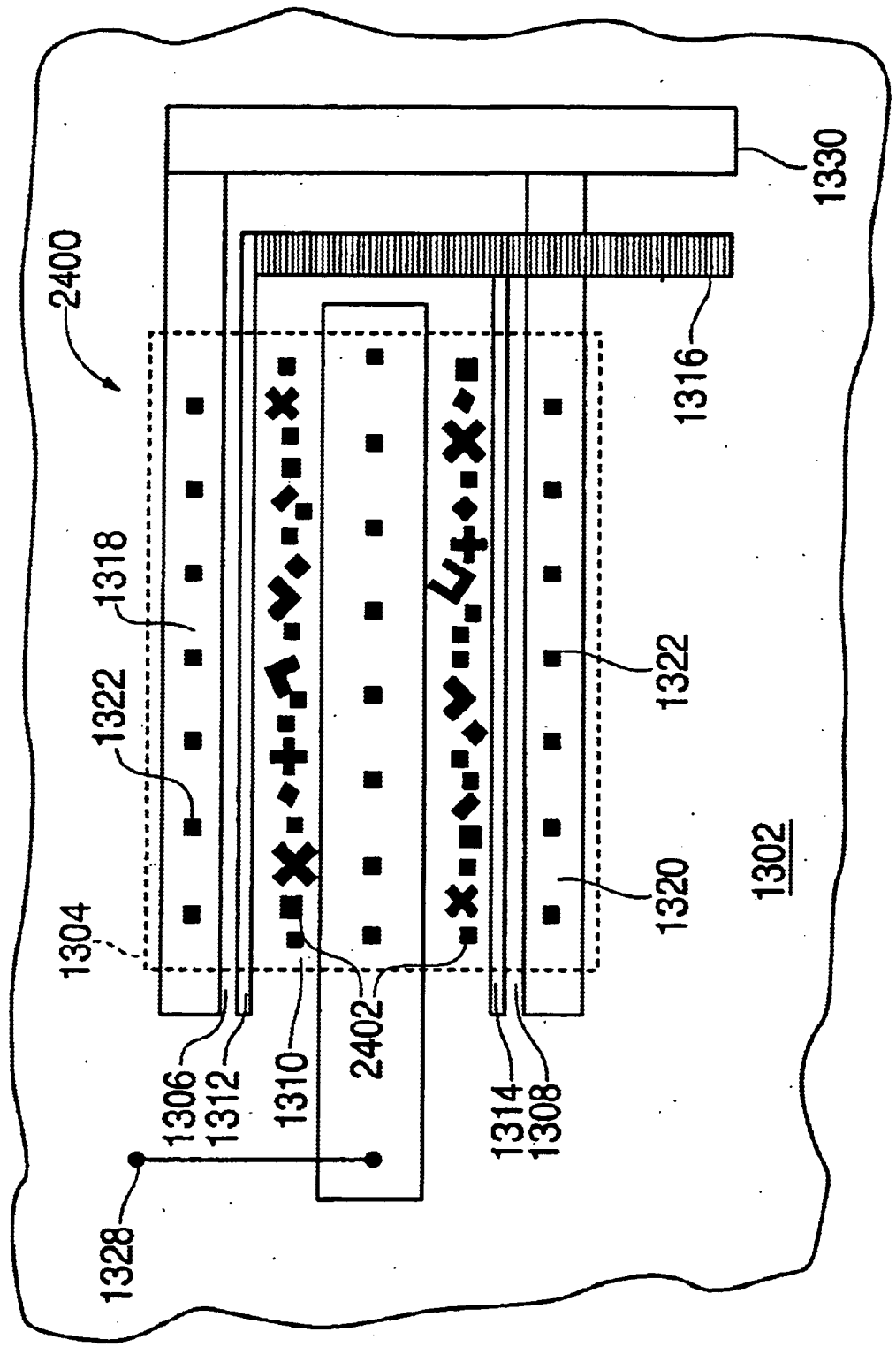
FIG. 24 illustrates an ESD protection device constructed according to an eighteenth embodiment of the present invention.

FIG. 24 illustrates an ESD protection device 2400 according to an eighteenth embodiment of the present invention. Device 2400 includes randomly distributed current divider segments 2402 formed within drain diffusion region 1310. Segments 2402 can be provided with a variety of shapes including one or more of square, rectangular, circular, cross-shaped, T-shaped, V-shaped, L-shaped, U-shaped, and any other odd shapes. More generally, segments 2402 can include segments of the same shape but of different size or orientation. The random distribution of segments 2402 includes their respective centers of areas being unevenly distributed. Alternatively, the respective centers of areas can be evenly distributed or aligned while the shapes are oriented in a manner to provide an uneven, or random, distribution. In one construction, segments 2402 are provided to all be small such that the largest dimension is less than or equal to six times the length of the channel region, i.e., that length being substantially the distance between the source and drain regions of an MOS transistor structure, or between the emitter and collector regions of a bipolar structure.

Each segment 2402 can be formed of polysilicon or field oxide. In an alternate construction, gates 1312 and 1314 can be replaced with stripes of field oxide and interconnect 1316 can be eliminated.

Figure 25:
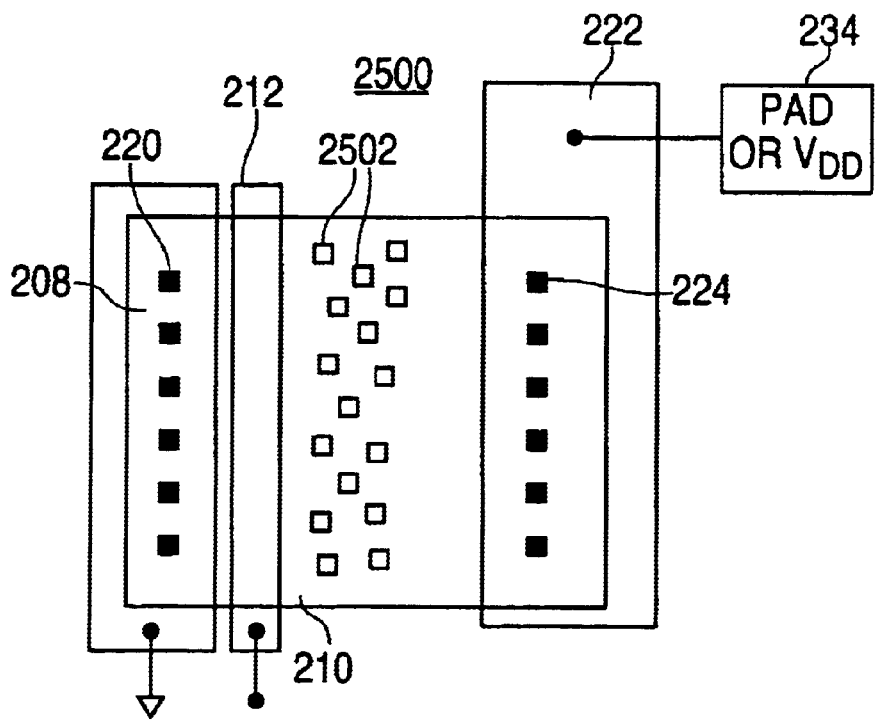
FIG. 25 illustrates an ESD protection device that represents an alternate construction of the device illustrated in FIG. 24.

FIG. 25 illustrates an ESD protection device 2500 that represents an alternate construction of device 2400. While device 2500 is illustrated as having a single gate, it can be constructed to have a plurality of, such as an even number of gates, as in device 2400. Device 2500 differs from device 2400 in providing a plurality of small, similarly shaped current divider segments 2502 that are unevenly, or randomly, distributed in drain diffusion region 210. The uneven distribution of segments 2502 is preferably achieved by providing random distances between adjacent ones of segments 2502. The largest dimension of each of segments 2502 is less than or equal to six times the length of the channel region, i.e., that length being substantially the distance between the source and drain regions. Each of segments 2502 is formed of polysilicon or field oxide.

Figure 26:
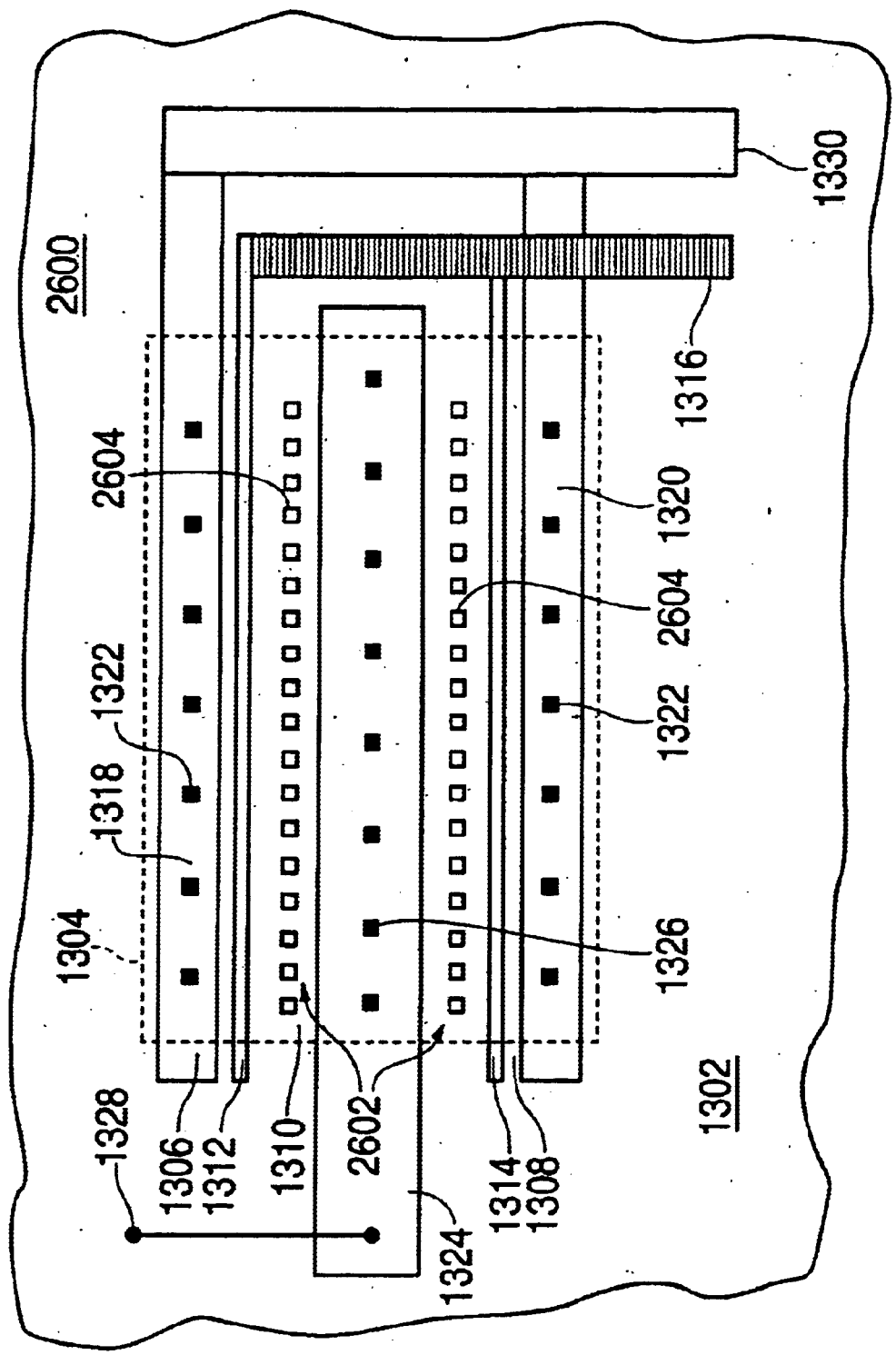
FIG. 26 illustrates an ESD protection device that represents another alternate construction of the device illustrated in FIG. 24.

FIG. 26 illustrates an ESD device 2600 that represents another alternate construction of device 2400. With reference to FIG. 26, device 2600 includes groups 2602 of small current divider segments 2604 in and along drain region 1310 adjacent to each of gates 1312 and 1314. Each array 2602 is disposed within region 1304 with the respective left and right ends of each array 2602 approximately equidistant from the left and right edges, respectively, of region 1304. However, arrays 2602 can be disposed relative to the edges of region 1304 in the same manner as illustrated in other embodiments described herein.

Device 2600 can also be alternatively provided with a plurality of evenly, unevenly or randomly distributed segments 2604 instead of arrays 2602 disposed along gates 1312 and 1314 in drain region 1310.

In the operation of an ESD protection device consistent with the present invention, current flow through the drain region is divided by the current divider segments. This results in a more uniform distribution of current across the drain region and increased impedance in the drain region.

During an ESD event, the high ESD voltage at the anode (drain region) causes junction avalanche breakdown, which causes generation of electron-hole pairs in the n+ diffusionto-p-well junction. The electrons are collected by the anode while the holes flow in the substrate towards the source (cathode) junction. The hole current flow induces an IR voltage drop in the p-well, or p-type substrate, thus causing a forward bias between the p-well and the n+ source junction. The forward-biased source junction injects many electrons into the p-well. These injected electrons are collected by the drain junction and more electron-hole pairs are generated due to high-field impact ionization in the drain junction. This process iterates as the known snap-back characteristic of ESD current absorption while limiting the anode-to-cathode transient voltage. In conventional devices, the high current and high field at the drain junction near the gate generates heat and raises local temperature, which may cause damage to the drain contacts or the gate.

Current divider segments consistent with the present invention create a pseudo-collector structure in that, during snap-back, the electrons injected from the forward-biased source junction are partially absorbed by the drain junctions around the periphery of each segment. This effectively reduces the ESD current density at the drain junction near the gate. Also, the electric field is higher at the corners of the segments than at the drain junction next to the gate due to a corner-electric-field-crowding effect. This higher electric field at the corners of the segments, particularly those corners near the gate, helps the impact ionization process to generate more electron-hole pairs in a positive feedback to facilitate an early trigger of the snap-back during an ESD event. For example, in device 2400 shown in FIG. 24, the corner-electric-field-crowding effect occurs at the inside and outside corners of the various shapes of segments 2402. This has the effect of lowering the trigger voltage of device 2400.

The benefits of the pseudo-collector structure can be further enhanced by positioning the current divider segments such that the weight or area center of all segments in the drain region is closer to the gate or channel region than to the drain contacts. The current divider segments are so positioned in the devices illustrated in FIGS. 2–12, 24, and 25. Being closer to the gate or channel region makes it easier to collect electrons injected from the source side of the device during an ESD event.

Further, the array or group of small current divider segments in devices 2500 and 2600 are effective for improving performance whether the ESD device is formed by a non-silicided or silicided process. In the non-silicided process, the drain diffusion region already has a high resistance and the array or group of small segments do not substantially further increase resistance of the ESD current path. However, the increased depletion region along the periphery of the segments helps absorb injected carriers from the forward biased source junction with the p-substrate 1206 and thereby reduce the current density during an ESD event. This effect improves ESD performance of the device.

Experimentally, a GGNMOS (Ground-Gate NMOS) transistor such as illustrated in FIG. 6 but having six polysilicon gate fingers was constructed using 0.45 $\mu$m non-silicide CMOS technology. Each gate finger had a 0.6 $\mu$m gate length, i.e., across the channel between the source and drain regions, and 75 $\mu$m width. In each drain region there was an array of field-oxide segments of 0.75 $\mu$m by 3 $\mu$m, separated from each other by 3 $\mu$m distance, and kept at approximately 0.5 $\mu$m from the gate and 1.5 $\mu$m from the nearest drain contact. In this structure the drain contact-to-gate spacing was 5 $\mu$m, while the source contact-to-gate spacing was 2 $\mu$m. It was found that the structure showed consistent HBM (Human-Body-Model) ESD performance of 6.5 KV to over 8 KV, while a conventional structure without the field oxide segments showed widely fluctuating ESD voltages starting from as low as 1.5 KV.

The above described experimental device demonstrated superior ESD performance based on a non-silicided process. It is noted that the width of each of the parallel field oxide segments (0.75 $\mu$m) is less than the spacing (3 $\mu$m) between adjacent field oxide segments. The spacing between adjacent current divider segments being larger than their width means there was only limited drain resistance increase. The significant ESD performance improvement suggests the pseudo-collector effect is especially significant for this type of structure formed by a non-silicided process. Nevertheless, the structure can also be used in silicided or salicided process.

Additionally, another advantage of the current divider segments is the improved segmentation or partial segmentation effect they provide and the associated increased resistance in the drain region. While segmentation improves ESD performance for general CMOS process technology, the increase in drain resistance is particularly beneficial in devices formed by a silicided diffusion process. The current divider segments serve to segment the N+ drain diffusion region into multiple smaller parallel-aligned diffusion regions. This substantially segments the MOS transistor device into a number of smaller, aligned MOS protection transistors. Each of these smaller ESD protection MOS transistors has a drain resistor due to the N+ diffusion region resistance. When ESD current flows into any of these segmented MOS transistors, the series drain resistance increases the drain voltage in the corresponding area, thereby forcing the ESD current to also flow into the other small MOS transistors, which are effectively connected in parallel. This results in the even distribution of the ESD discharge current, which significantly enhances the robustness of the entire MOS transistor. Further, since all the drain resistors are arranged in parallel, the effective total drain resistance is much smaller than that of each individual segmented region. The effective drain resistance therefore does not affect the normal effectiveness of the NMOS protection transistor.

In some instances, devices including field oxide current divider segments produced using a salicide process may experience junction leakage along the junction between the segment and the diffusion region. In device 450 illustrated in FIGS. 4C and 4D, the provision of a layer of polysilicon over the field oxide and extending beyond the edge thereof minimizes the possibility of such leakage.

Thus, devices constructed according to the present invention will provide improved ESD protection performance because of one or more of the mechanisms described above, depending on the exact layout of each current divider structure and how much drain resistance increase is associated with a particular layout and process.

It is clear from the disclosure that a current divider can be an island structure of an arbitrary shape. The current dividers block ion implantation during formation of the source/drain regions, or the emitter/collector regions.

Further, the formation of source and drain regions can be based on lightly doped drain (LDD), double diffusion drain (DDD) or any conventional source/drain formation process and structure. Additionally, a combination of the disclosed structures and a conventional ESD implant technique for improving ESD performance can also be practiced within the scope of the present invention.

While embodiments of an ESD protection device including current divider segment formed of polysilicon or field oxide have been disclosed, the invention is not so limited. ESD protection devices consistent with the present invention can include current divider segments constructed by overlapping polysilicon over part of field oxide.

Embodiments of the present invention can be fabricated with a variety of techniques including salicide, silicide and non-silicide processes. Further, ESD protection devices consistent with the present invention can be fabricated by process technologies including, for example, CMOS, NMOS, BiCMOS processes or bipolar processes (without use of polysilicon current divider segments).

While embodiments of the present invention include formation of an ESD protection device on a semiconductor substrate, the invention can be practiced with equal effectiveness using a silicon-on-insulator (SOI) substrate or silicon with implanted oxide layer (SIMOX).

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. An electrostatic discharge protection device, comprising:
   a substrate;
   a first diffusion region formed in the substrate;
   a second diffusion region formed in the substrate adjacent to and paced from the first diffusion region;
   at least one contact for making a conductive connection to the first diffusion region;
   a channel formed in a third region between the first and second diffusion regions; and
   a plurality of current divider segments unevenly and randomly distributed within the first diffusion region.

2. The device of claim 1, wherein the largest dimension of each segment is less than or equal to substantially six times a length of the channel.

3. The device of claim 1, wherein the plurality of segments are formed of polysilicon segments, field oxide segments, or a combination polysilicon and field oxide segments.

4. The device of claim 1, wherein
   the plurality of segments includes a first row of segments;
   each one of the first row of segments has a center-of-area, the respective centers-of-area are not aligned in a straight line.

5. The device of claim 1, wherein said segments include the first segment formed of a polysilicon layer or a field oxide layer; and the second segment formed of a polysilicon layer or a field oxide layer.

6. The device of claim 1, further including a dielectric layer formed over the channel.

7. The device of claim 6, further including a conductive element formed over the dielectric layer.

8. The device of claim 7, wherein
   the conductive element is a polysilicon gate element; and
   the dielectric layer is an oxide layer.

9. The device of claim 1, wherein at least one of the segments is positioned between the at least one contact and the channel.

10. The device of claim 1, wherein the first segment is formed of a dielectric layer.

11. The device of claim 10, wherein the dielectric layer is a field oxide layer.

12. The device of claim 11, wherein the field oxide layer is formed by one of a LOCOS process and a trench isolation process.

13. The device of claim 1, wherein the first segment is formed of a conductive layer over a dielectric layer.

14. The device of claim 13, wherein
   the conductive layer is a polysilicon layer; and
   the dielectric layer is a gate oxide layer.

15. The device of claim 1, wherein at least one of said segments has a construction selected from a square, a circle, a cross shape, a T shape, a V shape, a U shape, and an L shape.

16. The device of claim 1 wherein at least one of said segments has a first portion in a construction selected from a square, a circle, a cross shape, a T shape, a V shape, a U shape, and L shape.

17. The device of claim 1, wherein
   each one of said segments has a center-of-area; and
   at least a first center-of-area being not aligned with a second and third centers-of-area.

18. The device of claim 1, wherein at least one current divider segment of the plurality of current divider segments includes an oxide spacer formed on sidewalls of the at least one current divider segment.

19. An electrostatic discharge protection device, comprising:
   a substrate;
   a first diffusion region formed in the substrate;
   a second diffusion region formed in the substrate adjacent to and spaced from the first diffusion region;
   contacts for making a conductive connection to the first diffusion region;
   a channel formed in a third region between the first and second diffusion regions; and
   a plurality of current divider segments formed within the first diffusion region and being unevenly and randomly distributed therein,
   wherein at least one of the plurality of current divider segments is completely surrounded by the first diffusion region.

20. The device of claim 19, wherein at least one current divider segment of the plurality of current divider segments includes an oxide spacer formed on sidewalls of the at least one current divider segment.

21. An electrostatic discharge protection device, comprising:
   a substrate;
   a first diffusion region formed in the substrate;
   a second diffusion region formed in the substrate adjacent to and spaced from the first diffusion region;
   a contact for making a conductive connection to the first diffusion region;
   a channel formed in a third region between the first and second diffusion regions;
   a plurality of current divider segments formed within and completely surrounded by the first diffusion region and unevenly and randomly distributed therein, including first and second segments formed in at least one of different shapes, different sizes, and different orientations with respect to each other.

22. The device of claim 21, wherein the different shapes are selected from a square, a circle, a cross shape, a T shape, a V shape, a U shape, and an L shape.

23. The device of claim 21, wherein the different shapes differ from each other with respect to at least one of length, width, size, and area.

24. The device of claim 21, wherein at least one current divider segment of the plurality of current divider segments includes an oxide spacer formed on sidewalls of the at least one current divider segment.

25. An electrostatic discharge protection device, comprising:

a substrate;

a first diffusion region formed in the substrate;

a second diffusion region formed in the substrate adjacent to and spaced apart from the first diffusion region;

a contact for making a conductive connection to the first diffusion region;

a channel formed in a third region between the first and second diffusion regions; and a plurality of current divider segments formed within and completely surrounded by the first diffusion region and unevenly and randomly distributed therein, wherein said segments include a first segment adjacent to a second segment and spaced apart from the second segment by a first gap in a first direction;

said segments further include a third segment adjacent to the second segment and spaced apart from the second segment by a second gap in the first direction; and said first gap being larger than the second gap.

26. The device of claim 25, wherein at least one current divider segment of the plurality of current divider segments includes an oxide spacer formed on sidewalls of the at least one current divider segment.

27. An electrostatic discharge protection device, comprising:

a substrate;

a first diffusion region formed in the substrate;

a second diffusion region formed in the substrate adjacent to and spaced apart from the first diffusion region;

a contact for making a conductive connection to the first diffusion region;

a channel formed in a third region between the first and second diffusion regions; and a plurality of current divider segments formed within and completely surrounded by the first diffusion region and unevenly and randomly distributed therein, wherein said segments include a first segment having a first center-of-area, adjacent to a second segment having a second center-of-area, and being spaced apart from the second segment;

a third segment having a third center-of-area, adjacent to the second segment, and being spaced apart from the second segment;

a first distance in a first direction between the first and second centers-of-area;

a second distance in the first direction between the third and second centers-of-area; and the first distance being larger than the second distance.

28. The device of claim 27, wherein at least one current divider segment of the plurality of current divider segments includes an oxide spacer formed on sidewalls of the at least one current divider segment.

29. An electrostatic discharge protection device, comprising:

a substrate;

a first diffusion region formed in the substrate;

a second diffusion region formed in the substrate adjacent to and spaced from the first diffusion region;

a contact region for making a conductive connection to the first diffusion region;

a channel formed in a third region between the first and second diffusion regions; and a plurality of current divider segments unevenly and randomly distributed within the first diffusion region between said contact region and the channel and a center of the current divider segments formed within the first diffusion region being closer to the channel than to the contact region.

30. The device of claim 29, wherein the contact region includes a plurality of contacts.

31. The device of claim 29, wherein said center is an area center.

32. The device of claim 29, wherein said center is a weight center.

33. The device of claim 29, wherein at least one current divider segment of the plurality of current divider segments includes an oxide spacer formed on sidewalls of the at least one current divider segment.

34. The device of claim 29, wherein the first diffusion region is a drain region.

35. The device of claim 29, wherein the first diffusion region is a collector region.

36. The device as in any one of claims 1, 19, 21, 25, 27 and 29, wherein the first diffusion region includes a heavily doped region, and at least one current divider segment is characterized by an implant blocking region completely surrounded by the heavily doped region.

* * * * *